(12) United States Patent
MacWilliams et al.

(10) Patent No.: US 8,200,883 B2
(45) Date of Patent: *Jun. 12, 2012

(54) MICRO-TILE MEMORY INTERFACES

(75) Inventors: Peter MacWilliams, Aloha, OR (US);
James Akiyama, Beaverton, OR (US);
Douglas Gabel, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/114,903

(22) Filed: May 24, 2011

(65) Prior Publication Data

US 2011/0225390 A1 Sep. 15, 2011

Related U.S. Application Data

(63) Continuation of application No. 11/174,134, filed on Jun. 30, 2005.

(51) Int. Cl.
*G06F 12/00* (2006.01)
(52) U.S. Cl. .............. 711/5; 711/4; 711/100; 711/102; 711/103; 711/104; 711/105; 711/106; 365/230.01; 365/230.02; 365/230.03; 365/230.05; 365/49.1; 365/189.011; 365/189.02; 365/189.04; 365/189.14; 365/189.19; 710/36; 710/37; 710/38; 710/39; 710/40
(58) Field of Classification Search .................. 711/4, 5, 711/100, 103–105, 108; 710/36–40; 365/189.011, 365/189.02, 189.04, 189.14, 189.19, 230.01, 365/230.02, 230.03, 230.05, 49.1
See application file for complete search history.

(56) References Cited

U.S. PATENT DOCUMENTS

| 5,034,917 A | 7/1991 | Bland et al. |
| 5,142,627 A | 8/1992 | Elliot et al. |
| 5,251,310 A | 10/1993 | Smelser et al. |
| 5,412,613 A | 5/1995 | Gaibi et al. |
| 5,504,875 A | 4/1996 | Mills et al. |
| 5,710,550 A | 1/1998 | Hsieh et al. |

(Continued)

FOREIGN PATENT DOCUMENTS

EP 0 188 828 A2 7/1996

(Continued)

OTHER PUBLICATIONS

PCT International Search Report for PCT Application No. US2006/026072, mailed Feb. 26, 2007 (4 pages).

(Continued)

*Primary Examiner* — Tuan Thai
*Assistant Examiner* — Zhuo Li
(74) *Attorney, Agent, or Firm* — Blakely, Sokoloff, Taylor & Zafman LLP

(57) ABSTRACT

In one embodiment of the invention, a memory integrated circuit is provided including an address decoder to selectively access memory cells within a memory array; a mode register with bit storage circuits to store an enable bit and at least one sub-channel select bit; and control logic. The control logic is coupled to a plurality of address signal lines, the address decoder, and the mode register. In response to the enable bit and the at least one sub-channel select bit, the control logic selects one or more of the address signal lines to capture independent address information to support independent sub-channel memory accesses into the memory array. The control logic couples the independent address information into the address decoder.

17 Claims, 14 Drawing Sheets

U.S. PATENT DOCUMENTS

| | | |
|---|---|---|
| 5,768,584 A | 6/1998 | MacDonald et al. |
| 5,781,926 A | 7/1998 | Gaskins et al. |
| RE36,052 E | 1/1999 | Kobayashi et al. |
| 5,875,470 A | 2/1999 | Dreibelbis et al. |
| 5,901,332 A | 5/1999 | Gephardt et al. |
| 5,913,044 A | 6/1999 | Tran et al. |
| 6,076,139 A | 6/2000 | Welker et al. |
| 6,502,161 B1 | 12/2002 | Perego et al. |
| 6,549,483 B2 | 4/2003 | Kurjanowicz et al. |
| 6,839,266 B1 | 1/2005 | Garrett et al. |
| 8,032,688 B2 * | 10/2011 | MacWilliams et al. ........... 711/5 |
| 2003/0218216 A1 | 11/2003 | Matsumoto et al. |

FOREIGN PATENT DOCUMENTS

EP    1 001 347 A2    5/7000

OTHER PUBLICATIONS

PCT Written Opinion for PCT Application No. US2006/026072, mailed Feb. 26, 2007 (7pages).

International Preliminary Report on Patentability, PCT/US2006/026072, Jan. 9, 2008.

Office Action from counterpart EP Application No. 06 786 281.3-2210, mailed on Apr. 15, 2008, pp. 7 total.

* cited by examiner

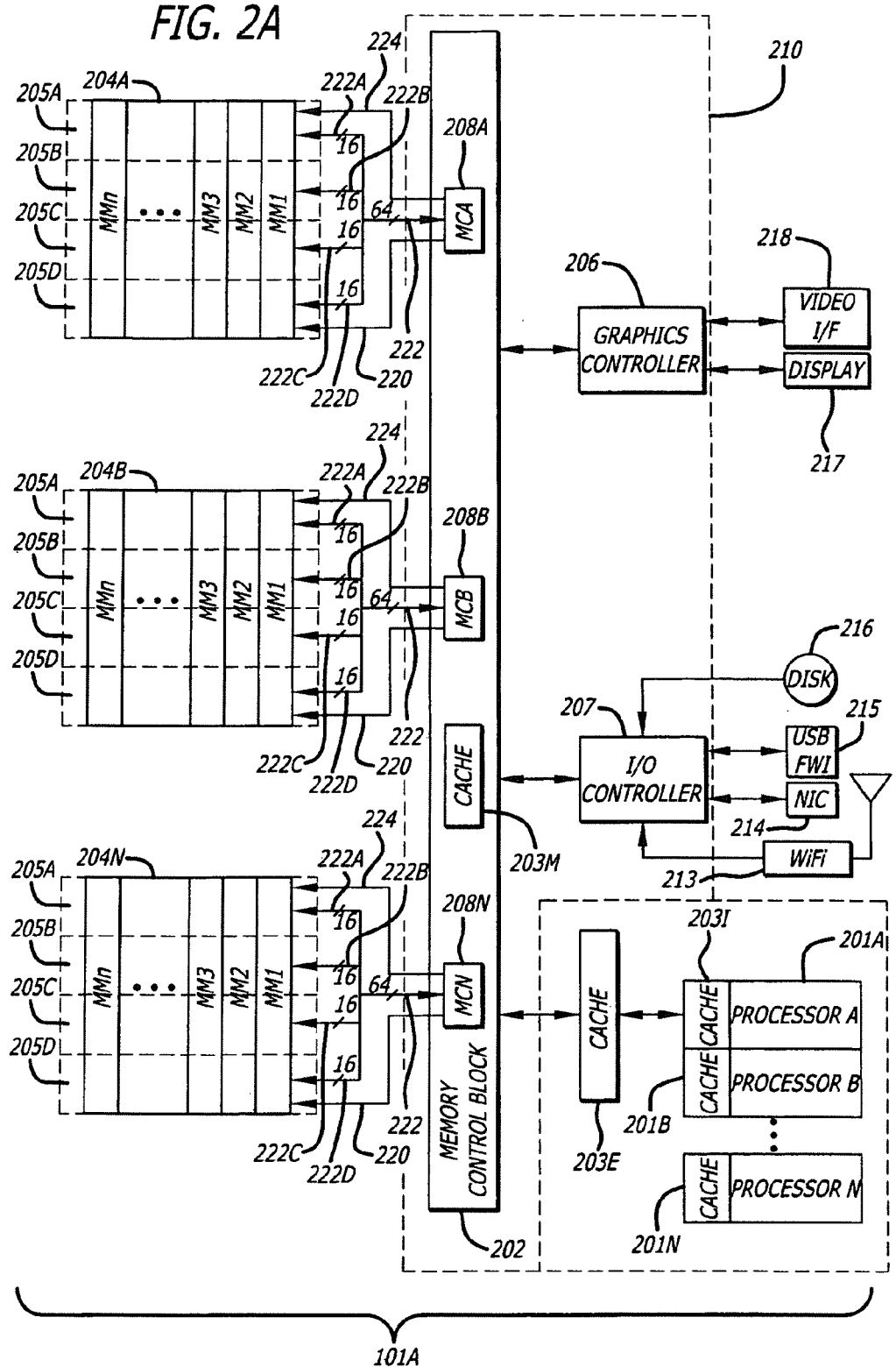

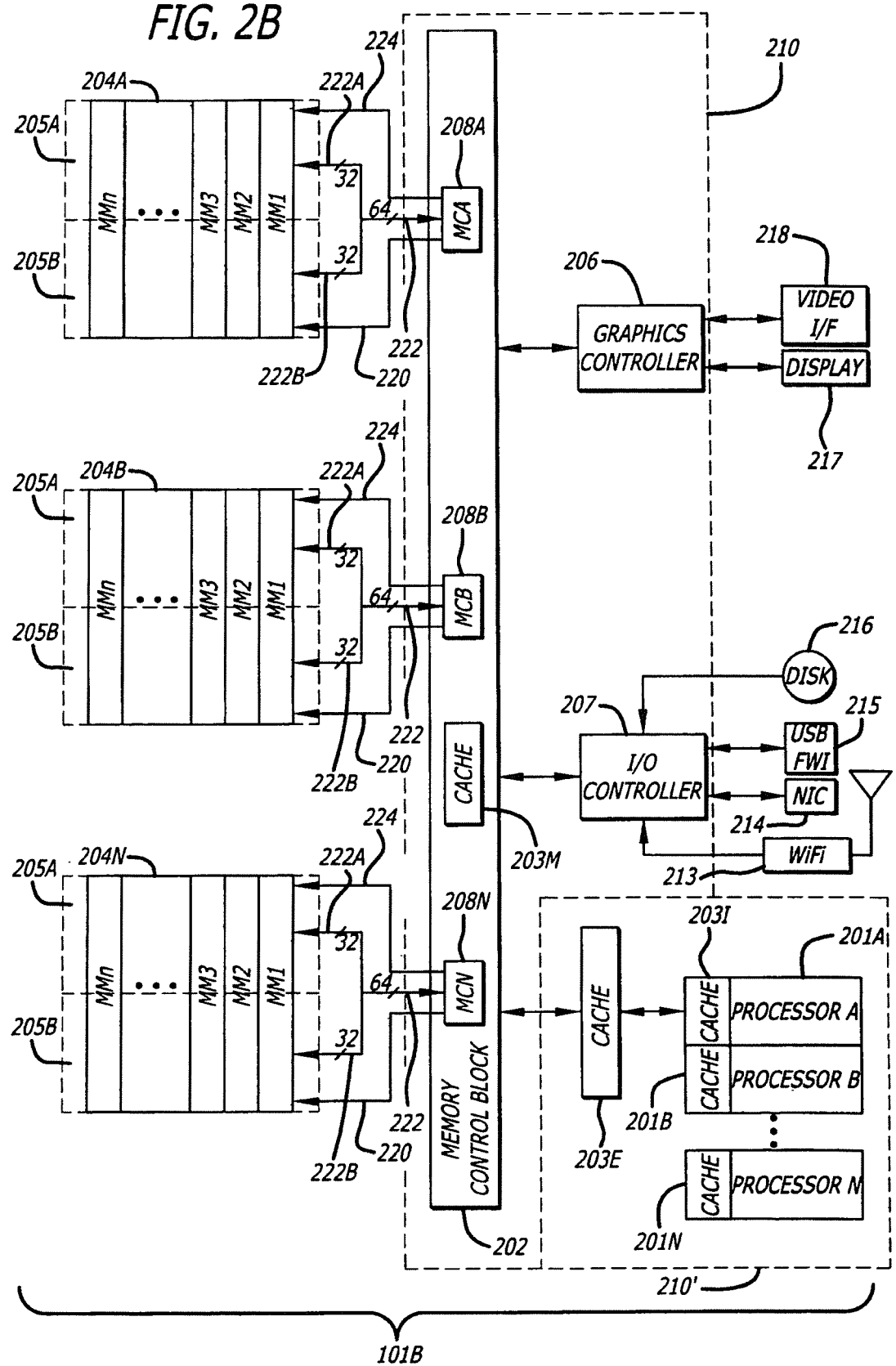

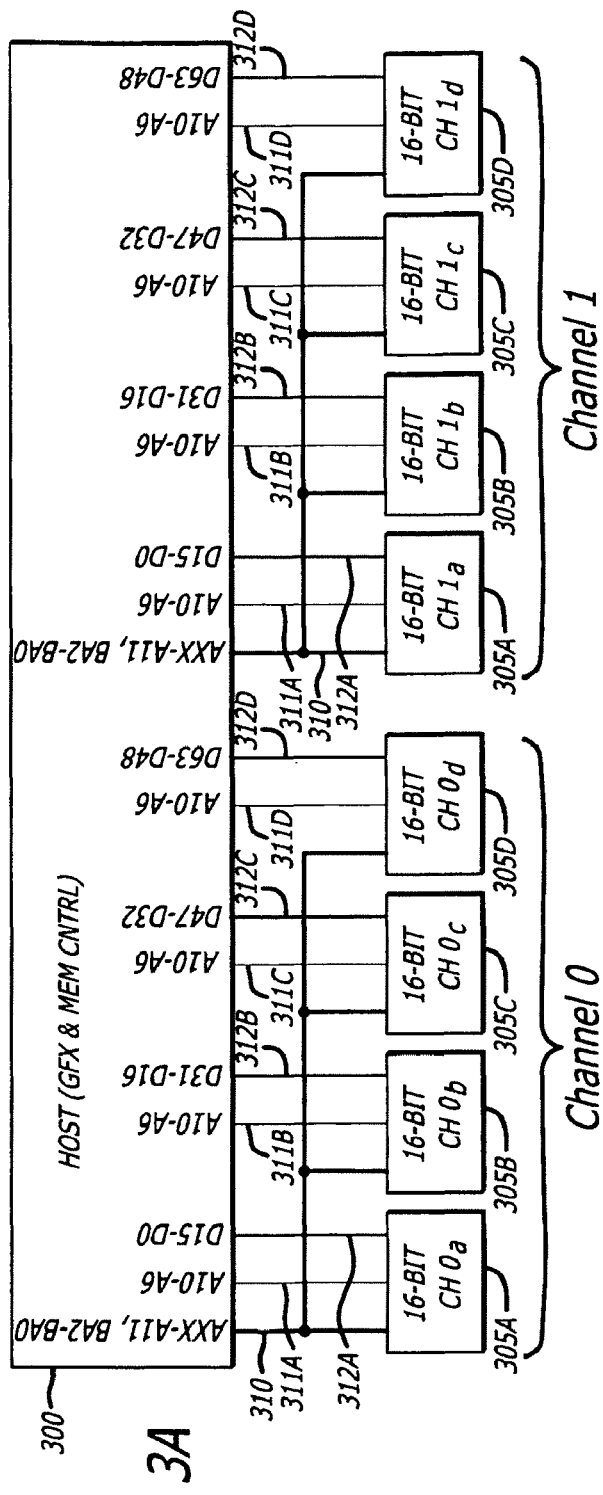

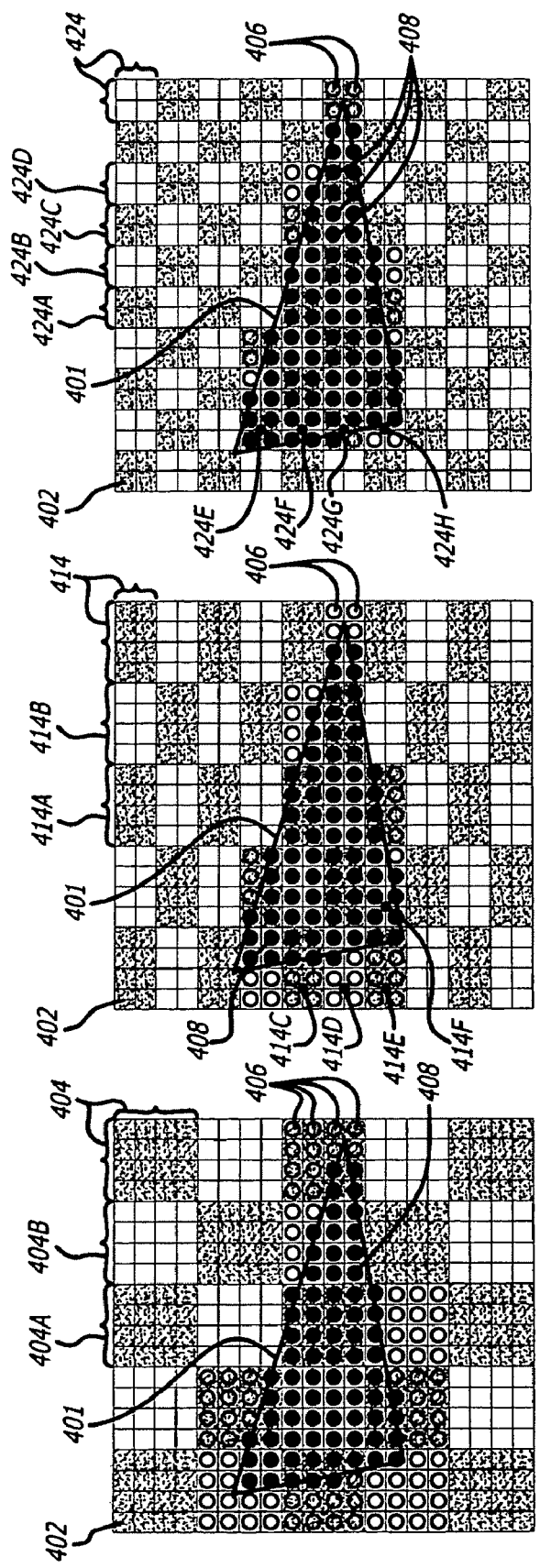

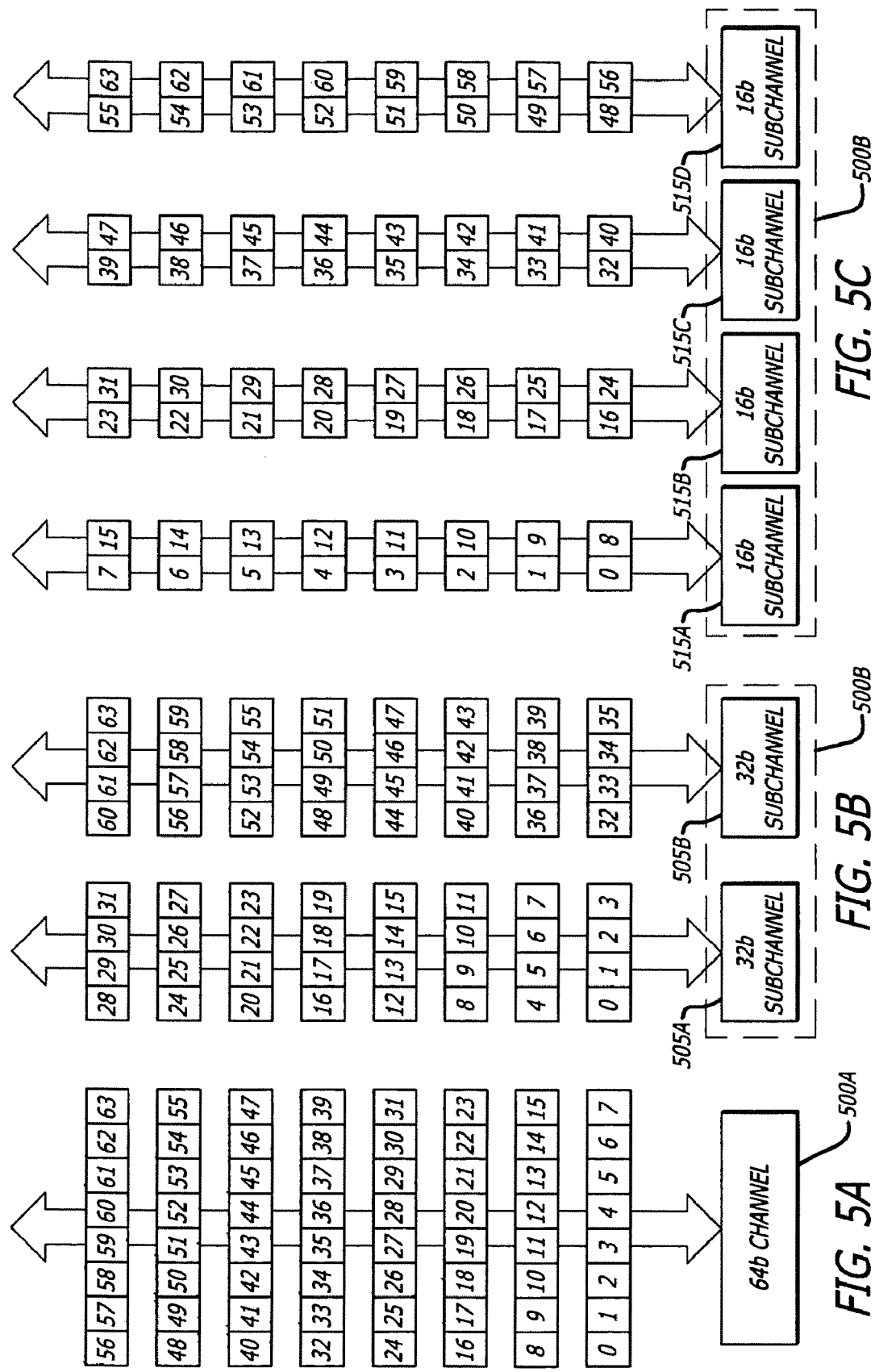

MICRO-TILE MEMORY INTERFACES

This application is a Continuation Application of U.S. patent application Ser. No. 11/174,134, filed on Jun. 30, 2005, and entitled "Micro-Tile Memory Interfaces", the priority of which is hereby claimed.

FIELD

Embodiments of the invention relate generally to memory architectures and specifically to memory channels between a memory controller and system memory.

BACKGROUND INFORMATION

In a memory architecture with a uniform or unified memory access, sometimes referred to as a unified memory architecture (UMA), a processor and a graphic controller share system memory to lower costs. Typically, a UMA memory architecture may be optimized to handle memory requests (read/write accesses) from the processor into the system memory. The typical UMA memory architecture compromises the memory requests made by the graphics controller. Today, graphics performance has become more important to support three dimensions (3D) as well as higher resolution.

In the typical UMA memory architecture, cache memory uses a fixed sixty four (64) byte cache-line to support memory requests made by both the processor and memory requests made by the graphics controller. A typical memory controller in a UMA memory architecture has one or two memory channels. Each memory channel shares all address lines in an address bus with each memory module in order to perform read or write accesses. The data bus in the typical memory channel is typically sixty-four (64) bits wide so that eight (8) bytes of contiguous data for a given address are accessed from memory at the same time. The bits of the data bus may be routed to memory modules in different ways depending upon the type of memory and memory size utilized.

While a processor typically uses all 64 bits of contiguous data accessed from the memory, a graphics controller typically may not. Much of the contiguous data may be discarded when a graphics controller makes a memory request in a UMA memory architecture. Thus, the bandwidth of the memory channel may be inefficiently used by memory requests issued by the graphics controller in the typical UMA memory architecture.

BRIEF DESCRIPTION OF THE DRAWINGS

The features of the embodiments of the invention will become apparent from the following detailed description in which:

FIG. 2A illustrates a block diagram of a first processing unit in which embodiments of the invention may be utilized.

FIG. 2B illustrates a block diagram of a second processing unit in which embodiments of the invention may be utilized.

FIG. 3A illustrates a high level block diagram of a memory control block coupled to a pair of memory channels each including four memory sub-channels.

FIG. 4A is a diagram illustrating the mapping of pixels on a video display to memory accesses over a memory channel without sub-channels using a linear memory access.

FIG. 4B is a diagram illustrating the mapping of pixels on a video display to memory accesses over a memory channel with two sub-channels supporting a micro-tiling memory access.

FIG. 4C is a diagram illustrating the mapping of pixels on a video display to memory accesses over a memory channel with four sub-channels supporting a micro-tiling memory access.

FIG. 5A is a diagram illustrating a linear sixty-four byte memory access over a sixty four bit wide memory channel.

FIG. 5B is a diagram illustrating independent sub-channel memory access of a pair of thirty-two byte memory accesses over a pair of thirty-two bit wide memory sub-channels.

FIG. 5C is a diagram illustrating independent sub-channel memory access of four sixteen byte memory accesses over four of sixteen bit wide memory sub-channels.

FIG. 6 illustrates an address signal line bit map for a memory channel.

Like reference numbers and designations in the drawings indicate like elements providing similar functionality.

DETAILED DESCRIPTION

Figure 1A:
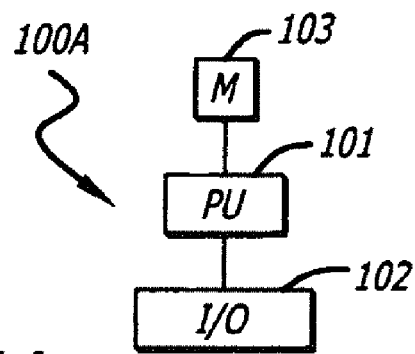
FIG. 1A illustrates a block diagram of a typical computer system in which embodiments of the invention may be utilized.

In the following detailed description of embodiments of the invention, numerous specific details are set forth in order to provide a thorough understanding of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The memory efficiency of an integrated graphics computer system is typically limited due to the size of a cache-line. Quite often the ideal memory access size for graphics is four to sixteen bytes of data since graphics processors operate on one or a few pixels or texels at a time. However, UMA memory architectures are optimized for a 64 byte cache-line to optimize processor memory efficiency. With a 64 byte cache-line, memory requests by a graphics controller result, on average, in a significant amount of data fetched from memory and never used by the graphics controller. The unused data may be referred to as over-fetch.

The embodiments of the invention including micro-tiling reduce the over-fetch of memory requests from a graphics controller while preserving cache-line requirements for a processor in a UMA memory architecture with an integrated graphics controller. Generally, micro-tiling includes a new memory architecture and a new memory controller architecture. While the new memory controller architecture is described, the focus of this application is on new memory architectures to support micro-tiling. To support a micro-tiling memory architecture, the new memory subsystem provides independent sub-channel memory accesses within a memory channel. These independent sub-channel memory accesses into a memory may be referred to as micro-tile or micro-tiled memory accesses and generally referred to as micro-tiling.

Briefly stated, micro-tiling enables a memory request to be composed of smaller requests for discontiguous sections or chunks of memory. The micro-tiling memory architecture allows read and write memory fetches to vary in size and structure based on the needs of the requestor. In order for the smaller chunks to be correctly identified, additional address information is provided into the system memory by the micro-tiled memory controller. For example, in one embodiment of the invention a sixty-four bit wide memory channel (the physical bit width) may be divided up into four sixteen bit wide sub-channels. In this implementation, a sixty-four byte memory access (the logical byte width of a memory channel) is composed of four discontiguous sixteen byte chunks (assuming that a memory transaction is a burst of 8 transfers). Each sub-channel uses some unique address information. FIG. 3A is an exemplary implementation of four sixteen bit sub-channels, each having some unique address information. Other implementations of a micro-tile memory architecture can vary the size of each sub-channel and the number of independent address lines provided into each sub-channel.

There are several methods available to supply additional independent address information to each sub-channel of the memory array including supplying additional address lines by routing new dedicated lines from the memory controller to the memory integrated devices or re-targeting unused error correction code (ECC) signal lines routed in a memory module to be additional address lines. The independent additional address information may also be supplied by overloading pre-existing address signal lines during typical periods of non-use, such as during a memory cycle when the column addresses are written into memory integrated circuits. In this case, micro-tiling support can be implemented in memory modules and still provide backward compatibility to pre-existing memory module implementations. These methods may be used separately, or in combination in embodiments of the invention to provide the additional address information over a desired number of address lines, including any additional address lines.

In one embodiment of the invention, additional address signal lines are routed over a motherboard to memory integrated circuits to support micro-tiling and micro-tiled memory accesses. The new address signal lines are dedicated address lines routed from the memory controller over the motherboard to the memory integrated circuit devices. In still another embodiment of the invention, additional address signal lines are routed over the motherboard to new connectors, and new memory modules with new pin assignments (pinout) are plugged into the new connectors.

In another embodiment of the invention, address signal overloading may be used to transfer additional addresses to support micro-tiling. Typical dynamic random access memory (DRAM) integrated circuits receive row addresses over the address signal lines when the row address strobe (RAS#) control signal is asserted low. The column addresses are received by the DRAM integrated circuit over a fewer number of address signal lines when the column address strobe (CAS#) control signal is asserted low. While row addresses are sent over all of the pre-existing address signal lines, it has been observed that there are oftentimes fewer column addresses sent over the same address signal lines. That is, fewer of the pre-existing address signal lines are used to transfer column address signals. Thus, additional address signals can be transferred to the DRAM integrated circuits over the unused address signal lines when the CAS# control signal is asserted low. In this manner, none or only a few additional address signal lines need be routed to support the additional addressing capability for micro-tiling.

In another embodiment of the invention, unused error correction coding or parity signal lines may be used to transfer additional addresses to support micro-tiling. In some memory modules, error correction coding (ECC) may be supported by having an ECC integrated circuit monitor the bits of data and an additional memory to store the ECC data. However, memory modules with ECC are typically only used in higher end systems, such as servers as they are more expensive. In desktop or client computers, where the numbers of computers are greater, ECC is typically unsupported as it is an additional expense. In these cases, a number of pins of a memory module set aside for ECC or parity typically go unused. In memory modules without ECC, the unused ECC or parity pins may be used to transfer additional addresses to support micro-tiling. Other unused no-connect (NC) pins of a memory module may also be used to provide additional independent address signal lines to support micro-tiling.

In still another embodiment of the invention, additional independent address signaling may be had by combining the additional address signal lines provided by the unused pins with address signal overloading during the transfer of the column addresses.

In a standard memory channel, such as a memory channel based on double data rate (DDR) DRAM technology, the logical width of the memory channel can be considered to be M bytes wide. There are eight bits in a byte of data. The logical width of the memory channel is somewhat related to the burst length of data transfers over a memory module. That is, M bytes of data can be consecutively accessed by data transfers that form a burst, by using consecutive addresses incremented from a base address. Typically, the base address of the block of bytes to be accessed (read or written) is an integer multiple of the logical width of the channel. The physical width of the memory channel is the bit width of the data bus between the memory controller and the memory modules. The typical minimum burst length may be eight memory cycles with a starting byte order that may be set by the least significant bits of the address lines. With a typical physical width of sixty-four bits, eight memory cycles accesses sixty-four bytes of data in a memory channel. Thus the typical logical width of the memory channel is sixty-four bytes of data.

As discussed previously, the logical width of the memory channel is the number of bytes that can be consecutively transferred with a base address and the physical width of the memory channel is the bit width of the data bus ("$W_{DB}$") between the memory controller and the memory modules. A micro-tiled memory system equally divides the logical width and the physical width of the memory channel into sub-channels having smaller logical byte widths and smaller physical bit widths.

The micro-tiling of memory breaks the physical width of the memory channel ($W_{DB}$ bits) and the logical width of the memory channel (M bytes) into S sub-channels ($W_{SC}$). Each sub-channel has a physical width of $W_{SC}=W_{DB}/S$ bits and a logical width of N=M/S bytes. Thus, N bytes of data may be transferred over $W_{SC}$ bits of data lines in each sub-channel for each burst of data transfers. A memory channel may have a total number of memory locations $T_{ML}$ to access in memory. Each sub-channel accesses a subset of the total memory locations ($T_{SML}$) of a memory channel where $T_{SML}=T_{ML}/S$.

In micro-tiling memory, each sub-channel can access a smaller granularity of data over the memory channel independently from each other. To make them completely independent, separate address signal lines may be routed from the memory controller to each sub-channel. To avoid routing too many separate address signal lines, some address signal lines may be shared across the sub-channels so that memory locations can be independently selected from a set of common addresses. Thus, the address that is presented to each sub-channel has a number of independent address bits ("I") whose value can be different from corresponding bits in the addresses presented to the other sub-channels. Thus, while the data transferred on each sub-channel represents a contiguous block of data, the blocks of data on each sub-channel are not necessarily formed from a contiguous address range.

Figure 1B:
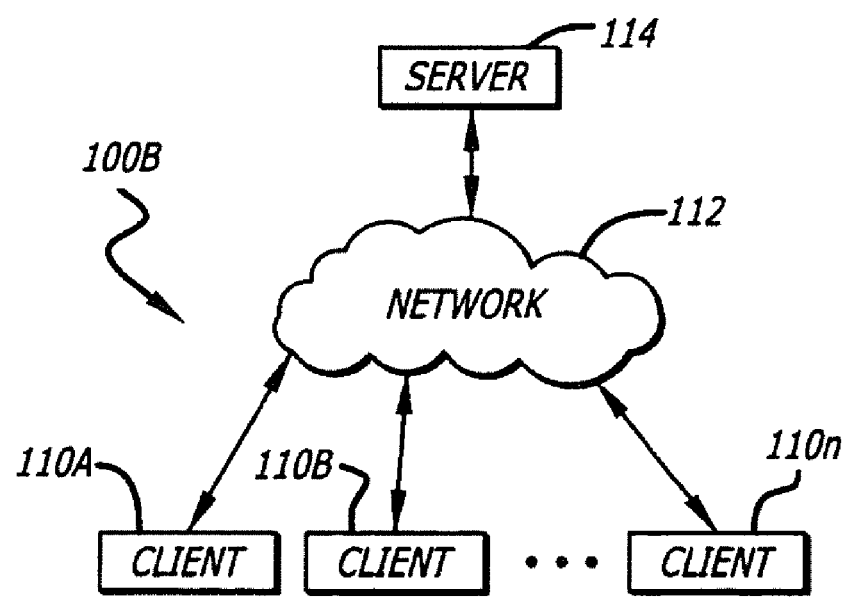
FIG. 1B illustrates a block diagram of a client-server system in which embodiments of the invention may be utilized.

The embodiments of the invention may be used in different systems such as those illustrated in FIGS. 1A-1B. Referring now to FIG. 1A, a block diagram of a typical computer system 100 in which embodiments of the invention may be utilized is illustrated. The computer system 100A includes a first processing unit 101; input/output devices (I/O) 102 such as keyboard, modem, printer, external storage devices and the like; and monitoring devices (M) 103, such as a CRT or graphics display. The monitoring devices (M) 103 may provide computer information in a human intelligible format such as visual or audio formats. The system 100 may be a number of different electronic systems other than a computer system.

Referring now to FIG. 1B, a client server system 100B in which embodiments of the invention may be utilized is illustrated. The client server system 100B includes one or more clients 110A-110M coupled to a network 112 and a server 114 coupled to the network 112. The clients 110A-110M communicate with the server 114 through the network 112 in order to transmit or receive information and gain access to any database and/or application software that may be needed on the server. The clients 110A-110M and the server 114 may be instances of the typical computer system 100A. The server 114 has a processing unit with memory and may further include one or more disk drive storage devices. The server 114 may be used in a storage area network (SAN) as a network attached storage (NAS) device, for example, and have an array of disks. The data access to the server 114 may be shared over the network 112 with the multiple clients 110A-110C.

Referring now to FIG. 2A, a block diagram of a first processing unit 101A in which embodiments of the invention may be utilized is illustrated. The processing unit 101A may include a processor circuit 201, a memory control block 202, external cache memory 203E, one or more memory channels 204A-204N, a graphics controller 206, and an input/output controller 207 coupled together as shown. A combination of two or more elements of the processor circuit 201, the memory control block 202, the cache memory 203E, the graphics controller 206, and the input/output controller 207 of the processing unit 101A may be integrated together into a single integrated circuit. For example, the memory control block 202, the graphics controller 206, and the input/output controller 207 may be integrated together as an integrated circuit 210. As another example, the processor circuit 201, the memory control block 202, the cache memory 203E, the graphics controller 206, and the input/output controller 207 may be integrated together as an integrated circuit 210'. As another example, the memory control block 202 with its memory controller may be integrated into the processor circuit 201. While the external cache memory 203E coupled between the processor circuit 201 and the memory control block 202 is illustrated as being part of the integrated circuit 210', it may be a separate circuit. Oftentimes, the cache memory 203E remains external to the integrated circuit 210' as it is more efficient to manufacture large memory capacities separately.

The processor circuit 201 may include one or more execution units or more than one processor (also referred to as core processors), such as processors A-N 201A-201N, as a multi-processor integrated circuit. Each processor of the processor circuit 201 may have one or more levels of an on-chip or internal cache memory 203I or share the same internal cache memory. Other levels of cache memory may be external to the processor 201 and interface to the memory controller, such as external cache memory 203E. The processor circuit 201 may also have an on-chip or internal random access memory (RAM) and an on-chip or internal read only memory (ROM) as a microcomputer may have. The processor 201, its one or more execution units, and the one or more levels of cache memory may read or write data (including instructions) through the memory control block 202 with the one or more memory channels 204A-204N.

The memory control block 202, coupled to and between the one or more memory channels 204A-204N and the processor 201 as well as the graphics controller 206, may optionally have its own internal cache memory 203M or it may be external as another level of cache memory. The memory control block 202 includes one or more micro-tile memory controllers MCA-MCN 208A-208N for each of the respective one or more memory channels 204A-204N.

Each of the one or more memory channels 204A-204N includes one or more memory modules MM1-MMn. Each memory module includes one or more memory integrated circuits or devices. The one or more memory integrated circuits or devices may be various types of memory integrated circuits including dynamic random access memory (DRAM) circuits, static random access memory (SRAM) circuits, or nonvolatile random access memory (NVRAM) circuits. However, in the preferred embodiment of the invention, the one or more memory integrated circuits are dynamic random access memory (DRAM) circuits.

Each of the one or more memory channels 204A-204N includes two or more memory sub-channels. In FIG. 2A, four memory sub-channels 205A-205D are included in each memory channel 204A-204N. Referring momentarily to FIG. 2B, two memory sub-channels 205A'-205B' are included in each memory channel 204A-204N. While two and four memory sub-channels are illustrated in each memory channel it is understood that other divisions of a memory channel may be had including even or odd numbers of sub-channels. This is particularly the case as the logical width or burst lengths of a memory channel increases.

The one or more memory modules MM1-MMN in each memory channel 204A-204N may be configured to support micro-tiling. An algorithm may be used by the memory control block to determine whether or not the one or more memory modules support micro-tiling. The one or more memory circuits or devices included on the one or more memory modules may be configured to support micro-tiling. The one or more memory circuits can be micro-tiled enabled (MTE) and assigned to support a specific memory sub-channel. The one or more memory circuits may include additional pins or have additional bits in a mode register to be micro-tiled enabled and assigned to a specific memory sub-channel. In the case of additional pins being provided by the memory circuits, external jumper pins, jumper wires, or micro-switches (for example, DIP switches) may be used to configure micro-tiling support. In the case of the mode register being provided in the memory circuits, the independent portion of the data bus into each sub-channel may be used to load the mode register with an appropriate loading strobe.

The I/O controller 207 may be coupled to the memory control block 202 to write data into the one or more memory channels 204A-204N so it is accessible by the processor 201. The processing unit 101A may further include a wireless network interface circuit (WNIC) 213, a wired network interface circuit or card (NIC) 214, a universal serial bus (USB) and/or firewire (FW) serial interface 215, and/or a disk drive 216 coupled to the I/O controller 207. The wireless network interface circuit (WNIC) 213 provides a radio connection to a base radio unit such as through a wireless local area networking, wifi (IEEE 802.11), Bluetooth, or other radio connection. The wireless networking interconnection (WNIC) 213 includes an antenna to couple by radio waves to a base radio unit or other mobile radio unit. The NIC 214 provides an Ethernet wired local area network connection. The USB/FW serial interface 215 allows for expansion of the system to include other I/O peripheral devices. The disk drive 216 is well known and provides rewriteable storage for the processor 201. The disk storage device 216 may be one or more of a floppy disk, zip disk, DVD disk, hard disk, rewritable optical disk, flash memory or other non-volatile storage device.

The graphics controller 206 may be coupled to the memory control block 202 to read and write data into the one or more memory channels 204A-204N. The processor 201 may write data into the one or more memory channels 204A-204N so that it is accessible by the graphics controller 206 and displayable on a graphics display or video device. A graphics display 217 may be coupled to the graphics controller 206. A video interface 218 may couple to the graphics controller 206. The video interface 218 may be an analog and/or digital video interface.

In the processing unit 101A, the processor 201, the I/O controller 207, and the graphics controller 206 may access data in the one or more memory channels 204A-204N through memory controllers in the memory control block 202. The memory controllers in the memory control block, interface to a respective memory channel 204A-240N to read and write data between the system memory and the processor 201, the I/O controller 207, and the graphics controller 206. In interfacing the micro-tiled memory controllers 208A-208N to the memory channels 204A-204N, respectively, there may be address signal lines 220 of an address bus, data signal lines 222 of a data bus, and control and clocking signal lines 224 as part of the memory interface. The input devices coupled to the I/O controller 207, such as the disk storage device 216, may also read and write information into the system memory.

Generally, the data signal lines 222 of the data bus are divided out into the S sub-channels. In FIG. 2B, where S is four, the data signal lines 222 of the data bus are divided out into four sub-channels, as illustrated by the sub-channel data lines 222A, 222B, 222C, and 222D, and coupled into the respective sub-channels 205A, 205B, 205C, and 205D. For example, a sixty four-bit bus is divided into four sets of sixteen bit data lines. Some of the address signal lines 220 may be shared into the sub-channels while other address signal lines are independent from one sub-channel to the next, in one embodiment of the invention. In another embodiment of the invention, the address signal lines 220 may be fully independent into each sub-channel. The address signal lines are further described below.

Referring now to FIG. 2B, a block diagram of a second processing unit 101B in which embodiments of the invention may be utilized is illustrated. The second processing unit 101B is similar to the first processing unit 101A in that it may include a processor circuit 201, a memory control block 202, external cache memory 203E, one or more memory channels 204A-204N, a graphics controller 206, and an input/output controller 207 coupled together as shown. For reasons of brevity, reference is made to the description of FIG. 2A for similar numbered elements as it is not repeated here. However, in the second processing unit 101B, each of the one or more memory channels 204A-204N are divided out into two sub-channels 205A' and 205B' as illustrated. That is, the number of sub-channels, S, is two. The data signal lines 222 of the data bus are divided out into two sub-channels as illustrated by the sub-channel data lines 222A and 222B and coupled into the respective sub-channels 205A' and 205B'. For example, a sixty four-bit bus may be divided into two sets of thirty-two bit data lines. Some of the address signal lines 220 may be shared into each of the sub-channels while other address signal lines are independent from one sub-channel to the next, in one embodiment of the invention. In another embodiment of the invention, the address signal lines 220 may be fully independent into each sub-channel.

Referring now to FIG. 3A, a block diagram of a two memory channels is illustrated. FIG. 3A illustrates a combined graphics and memory controller 300, also referred to as a host 300, coupled to a memory channel 0 304A and a memory channel 1 304B. Memory channel 0 304A and memory channel 1 304B are each divided into four sub-channels 305A, 305B, 305C, and 305D. Each memory channel has an independent micro-tile memory controller to support the sub-channels of the memory channel. Each memory channel has an independent data bus. For example assuming a total data bit width of 64 bits for each data bus of the memory channels, each sub-channel is coupled to an independent set of 16 bits of the data bus. Sub-channel 305A is coupled to data bits D15-D0, sub-channel 305B is coupled to data bits D31-D16, sub-channel 305C is coupled to D47-D32, and sub-channel 305D is coupled to data bits D63-D48 as is illustrated in FIG. 3A.

As previously discussed, some address signal lines may be shared into each of the sub-channels while other address signal lines are independent from one sub-channel to the next, in one embodiment of the invention. For example, address signal lines 310 (labeled Axx-A10, BA2-BA0) are shared to all sub-channels 305A-305D. That is, each of the address signal lines 310 may be fanned out and coupled into each sub-channel. In contrast, address signal lines 311A (first set labeled A9-A6) are independently coupled into sub-channel 305A. Address signal lines 311B (second set labeled A9-A6) are independently coupled into sub-channel 305B. Address signal lines 311C (third set labeled A9-A6) are independently coupled into sub-channel 305C. Address signal lines 311D (fourth set labeled A9-A6) are independently coupled into sub-channel 305D.

Ideally, enough independent address lines are provided to allow full addressability within the allocated memory page size granularity. The page size is typically set by software managing the graphic memory space. For example consider the case of a 4 kilo-byte (KB) page size allocation in a two-channel cache-line interleaved memory subsystem. 2 KB of the page are mapped to each memory channel. In which case, five address lines may be used to address thirty-two 64 B cache lines in each physical page of memory. Thus, fifteen additional independent address lines would be ideal for a four sixteen bit sub-channel implementation. These are shown as address signal lines 311B-D respectively labeled as the second, third, and fourth sets of address lines labeled A10-A6 over the original first set of address signal lines 311A labeled as the first set of address lines A10-A6. If fewer additional independent address lines are made available, the independent address space addressable by each sub-channel is reduced. If more independent address lines are made available into each sub-channel, the independent address space addressable by each sub-channel is increased. To implement two thirty-two bit sub-channels, it is desirable to have five additional independent address lines.

In one embodiment of the invention, extra address signal lines may be routed between the memory controller and the sub-channels to provide the independent address signal lines as illustrated in FIG. 3A. In another embodiment of the invention, address signals may be overloaded onto the pre-existing address lines. In yet another embodiment of the invention, a combination of routing extra address signal lines and overloading of address signals may be used to support micro-tiling. In yet another embodiment of the invention, each sub channel may be provided with a complete set of independent address lines without the shared address lines 310 illustrated in FIG. 3A. However, using the shared address signal lines 310 conserves printed circuit board area by avoiding the routing of independent address signal lines.

Referring momentarily to FIG. 6, an address signal line bit map for a memory channel is illustrated using shared and independent address bits. That is, FIG. 6 is an address bit map that illustrates the interpretation of the address bits in a physical address. A set of I independent address bits (IAB) is provided to each sub-channel to support micro-tiling. A set of zero or more SA shared address bits (SAB) may be provided to all of the sub-channels. A set of Q sub-channel select bits (SSB) are used in the assignment of a memory request to a sub-channel. A set of P sub-channel data address bits (SDAB) are used to address the bytes in each cache-line within a DRAM memory. The set of P SDAB bits are typically the least significant bits of the address signal line map. The set of Q SSB bits and the P SDAB bits are not actually routed between the memory controller and the sub-channel memory, it being understood that the base address of the block of data being accessed is an integer multiple of the burst size. That is, the P SDAB bits may be generated internally by a memory integrated circuit such as by a DRAM device in accordance with double data rate (DDR) memory specifications. While FIG. 6 illustrates certain address bits being chosen to be shared and independent address bits, other address bits may be assigned instead. That is, the division of the address bits above the P sub-channel data address (SDAB) bits into the SA shared address (SAB) bits and the I independent address (IAB) bits in general is arbitrary.

Referring now to FIGS. 4A-4C, idealized pixel map renderings of a triangle are illustrated using a tiled address space. FIG. 4A illustrates the rasterization of the triangle 401 in a tiled address space using a non-micro-tiled memory system in which the logical channel width is 64 bytes. FIGS. 4B-4C illustrate the rasterization of the triangle 401 in a tiled address space using a micro-tiled memory system. The unit of rasterization of the triangle 401 is a fragment 402. A fragment 402 may represent a pixel or a texel. A tiled address space is one in which a logically two-dimensional array of data is organized as a set of sub-arrays, such that the data within the subarray is stored in a contiguous range of the address space and are thus highly localized in memory. A logically two-dimensional array of data that is linearly addressed has no such sub-arrays; instead, data such as fragments 402 are addressed linearly across from left to right in a row and then down to the next row from top to bottom. Thus, vertically adjacent fragments 402 may be far apart in memory.

In comparison with FIG. 4A, FIGS. 4B-4C show how micro-tile memory accesses provide the advantages of smaller memory requests. Each of FIGS. 4A-4C show the rasterization of a triangle 401 for a different memory request size.

In FIG. 4A, a single memory request encompasses the data representing 16 fragments. Each of the individual squares 402 represents a fragment, typically thirty-two bits or four bytes of data per fragment. FIGS. 4A-4C illustrate a 20×20 array of fragments. A 4×4 array of fragments, as illustrated in FIG. 4A, is a span 404 and represents a sixty-four byte memory request. A subspan 424 is illustrated in FIG. 4C as a 2×2 array of fragments or a sixteen byte memory request. A double subspan 414 is illustrated in FIG. 4B and is a 32 byte memory request that is oriented as a 2×4 array of fragments.

The differences between FIGS. 4A-4C illustrate the theoretical reduction in over-fetch as the memory request size decreases. In each of the FIGS. 4A-4C, the triangle 401 requires access of the same number of fragments. However a memory access typically transfers the data of more than one fragment, such that it may include data representing fragments 408 within the triangle 401 and fragments 406 outside the triangle 401. Data representing fragments 406 outside of the triangle 401 are over-fetched, resulting in the inefficient use of the memory bandwidth.

In FIG. 4A, a 64 byte memory access transfers the data of a span 404, a 4×4 block of fragments. For example, span 404A is a first 64 byte memory access. Span 404B is a second 64 byte memory access. For example consider that the triangle 401 encompasses approximately fifty-seven pixels to render. For the 64 byte memory access case, ten memory accesses are needed to access the 65 fragments within the triangle. Data of an additional 95 fragments is accessed but might not be used.

In FIG. 4B, a 32 byte memory access transfers the data of a double sub-span, a 2×4 block of fragments or one-half of a 64 byte memory access. For example, double subspan 414A is a first 32 byte memory access. Double subspan 414B is a second 32 byte memory access. For the 32 byte memory access case, thirteen memory accesses are needed to access the 65 fragments within the triangle. Data of an additional 47 fragments is accessed but might not be used.

In FIG. 4C, a 16 byte memory access transfers the data of a sub-span, a 2×2 block of fragments or one-quarter of a 64 byte memory access. A span 424A is a first 16 byte memory access. A span 424B is a second 16 byte memory access. A span 424C is a third 16 byte memory access. A span 424D is a fourth 16 byte memory access. For the 16 byte memory access case, twenty-two memory accesses are needed to access the 65 fragments within the triangle. Data of an additional 13 fragments is accessed but might not be used.

Consider as another example that the triangle 401 requires sixty-five pixels or fragments (260 bytes) to display in each of FIGS. 4A, 4B and 4C. In FIG. 4A, approximately ten spans of memory are accessed including one-hundred sixty pixels or six-hundred forty bytes of data to render triangle 401. In FIG. 4B, approximately thirteen double subspans of data are accessed including one-hundred twelve pixels or four-hundred forty-eight bytes of data to render triangle 401. In FIG. 4C, approximately twenty-two subspans of data are accessed including eighty-eight fragments or three-hundred fifty-two bytes of data to render triangle 401. Thus in comparison with FIG. 4A, the over-fetched pixels or fragments 406 are reduced in FIGS. 4B and 4C by implementing micro-tile addressing with sub-channels within each memory channel.

As previously discussed, FIGS. 4B-4C illustrate the rasterization of the triangle 401 in a tiled address space using a micro-tiled memory system that includes memory sub-channels. In FIG. 4B, a 64 byte wide memory channel may be formed from two 32 byte wide memory sub-channels. In this case, a micro-tiled memory access combines two discontiguous 32 byte accesses into a single 64 byte access, one on each of the two sub-channels for a total size of 64 bytes. Rasterization of the triangle results in requests to access double subspans 414. For example, the micro-tile memory controller may combine requests to access double subspans 414C and 414D into a single micro-tiled memory access. As another example, the memory controller may combine requests to access double subspans 414E and 414F into a single micro-tiled memory request. Other combinations of requests to access double subspans may be formed into a single micro-tiled memory request or access. In one or more embodiments of the invention, the combined sub-channel accesses have a shared address bit pattern in the SA shared address bits.

In FIG. 4C, a 64 byte wide memory channel may be formed from four 16 byte wide memory sub-channels. In this case, a micro-tiled memory access combines four discontiguous 16 byte accesses into a single 64 byte access, one on each of the four sub-channels for a total size of 64 bytes. Rasterization of the triangle results in requests to access subspans 424. For example, the micro-tiling memory controller may combine requests to access subspans 424E, 424F, 424G, and 424H into a single micro-tiled memory access. Other combinations of requests to access subspans may be formed into a single micro-tiled memory request or access. In one or more embodiments of the invention, the combined sub-channel memory accesses have a shared address bit pattern in the SA shared address bits for each of the four memory sub-channels.

In the ideal case, it is assumed that all micro-tiled memory requests can be utilized by the micro-tile transaction assembler to build 64B memory transactions with no unused sub-channels. That is, the effectiveness of micro-tiling depends on the ability of the transaction assembler 326A, 326B to construct fully populated memory transactions.

Figure 3B:
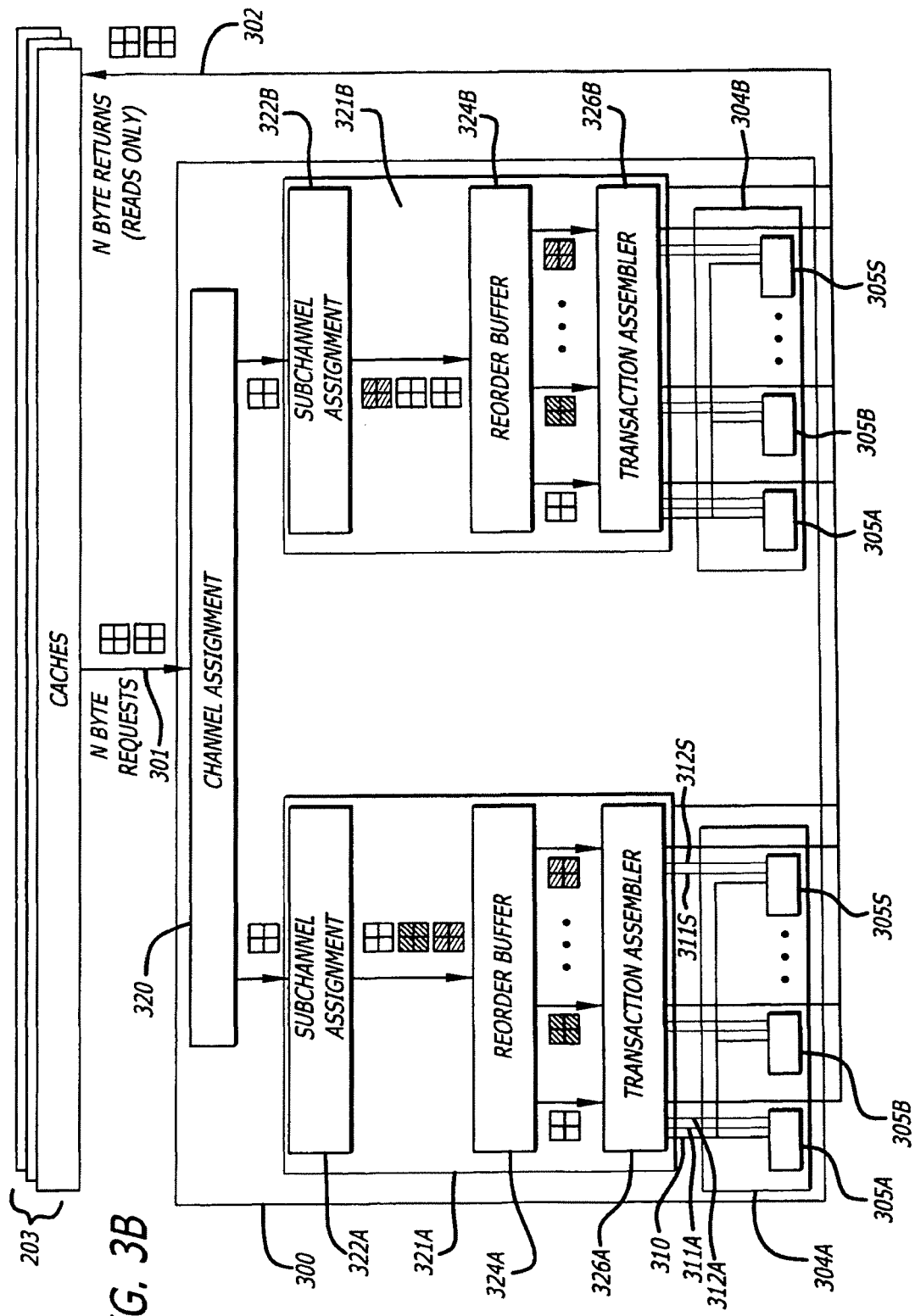
FIG. 3B illustrates a detailed block diagram of memory controllers in a memory control block coupled to cache memory and a pair of memory channels including a plurality of S sub-channels.

Referring now to FIG. 3B, a multi-channel memory subsystem is illustrated including a micro tiled memory control block 300 coupled to the system memory channels and one or more cache memory 203. Within the memory control block 300, the multi-channel memory subsystem includes a micro-tiling memory controller for each memory channel into system memory.

In FIG. 3B, two memory channels 304A and 304B are provided. Thus, two micro-tile memory controllers 321A and 321B are provided for the respective memory channels 304A and 304B. Each memory channel 304A, 304B may be composed of S sub-channels 305A-305S. Each sub-channel 305 is logically N bytes wide and B bits wide. Each memory channel 304 is logically M=N*S bytes wide.

Between the memory control block 300 and the cache memory 203 is a write data path 301 and a read data path 302 that can include command paths or address paths over which read and write requests can be made. N bytes are returned to the cache 203 from the memory control block 300 over the read data path 302 in the case of a read transaction. An N byte write request is provided from the cache 203 to the memory control block 300 over the write data path 301 in the case of a write transaction. While an N byte read or write request is made between the cache 203 and the memory control block 300, requests are depicted as arrays of 2×2 tiles to represent a 2×2 array of pixels or texels, such as my be used with four sub-channels.

The memory control block 300 includes a channel assignor 320, a first memory controller 321A, and a second memory controller 321B. The memory control block 300 is also coupled to memory channel zero 304A and memory channel one 304B. Memory channel zero 304A includes "S" sub-channels 305A-305S. Similarly, memory channel one 304B includes "S" sub-channels 305A-305S. Shared address lines 310 couple from each memory controller 322 into each sub-channel 305A-305S. Independent address lines 311A-311S couple into the respective sub-channels 305A-305S. Each of the data bus sub-channel portions 312A-312S is coupled into the respective memory sub-channels 305A-305S.

Each of the memory controllers 321A and 321B include a sub-channel assignor 322A-322B, a reorder buffer 324A-324B, and a transaction assembler 326A-326B respectively.

The memory request for N bytes of data, the logical width of a channel, is coupled into the channel assignor 320. The channel assignor assigns the memory request to either of memory channel 0 304A or memory channel 1 304B depending upon the circumstances including the variability of the memory channel. After being assigned to a memory channel by the channel assignor, the N byte request is coupled into the respective memory controller 321A or 321B and into the sub-channel assignor 322A or 322B.

The sub-channel assignor 322A and 322B assigns the N byte requests to one of the sub-channels 305A-305S. Referring momentarily to FIG. 6, the Identity Sub-channel Assignment, s, may be defined by the following process: (1) The request address, "A", is shifted right by the P SDAB bits, resulting in a new integer value $\tilde{A}$ (where, $\tilde{A}=A>>P$). (2) The value "s" for the Sub-channel Assignment is the least significant Q SSB bits of $\tilde{A}$ (e.g., s=$\tilde{A}$ & ((1<<Q)−1)).

Each of the micro-tiling memory controllers 321A-321B has a reorder buffer 324A-324B, respectively. The reorder buffer reorders the memory request into the sub-channels so as to increase the bandwidth efficiency in each memory channel. A request to read or write a block of N bytes of data at address "A" enters the memory controller 322A or 322B, is assigned to a sub-channel, and is placed in the reorder buffer. The reorder buffer may be implemented as a reorder queue for each sub-channel. Other implementations of the reorder buffer are possible.

The transaction assembler 326A, 326B forms a memory read transaction by selecting S read requests, one for each sub-channel, from the reorder buffer, such that all S requests have the same shared address bits. It forms a memory write transaction by selecting S write requests, one for each sub-channel, from reorder buffer, such that all S requests have the same shared address bits. For example, the transaction assembler 326A, 326B may assemble a 64 byte transaction in a memory channel from four 16 byte requests, one to each sub-channel.

When attempting to form a transaction, the transaction assembler in a micro-tiled controller may not be able to find a concurrent set of requests, one for each sub-channel, such that the SA shared address bits are the same across all sub-channels. In such a case, no data may be transferred on a sub-channel for which a request was not found, or if data is transferred over that sub-channel, the data can be discarded.

Referring now to FIGS. 5A-5C, exemplary byte ordering is illustrated for each memory channel 500A-500C. In FIG. 5A, memory channel 500A has a transfer size of 64 bytes numbering from 0 to 63. The logical width of 64 bytes may be accessed by a 64 bit physical width of memory channel.

In FIG. 5B, memory channel 500B may be divided into two memory sub-channels 505A and 505B, each of which transfers one-half of a 64 byte transfer, so that each sub-channel transfers 32 bytes. For memory sub-channel 505A, the memory bytes are that are accesses number from 0 to 31, reordered from that of FIG. 5A. For memory sub-channel 505B, the bytes that are accessed are numbered from 32 through 63, reordered from that of FIG. 5A.

In FIG. 5C, the memory channel 500C may be divided into four memory sub-channels, 515A, 515B, 515C, and 515D, each of which transfers one-fourth of a 64 byte transfer, so that each sub-channel transfers 16 bytes. Memory sub-channel 515A accesses memory bytes numbering from the 0 to 15, reordered from that of FIG. 5A. Memory sub-channel 515B accesses memory bytes 16 through 31, reordered from that of FIG. 5A. Memory sub-channel 515C accesses byte numbers 32-47, reordered from that of FIG. 5A. Memory sub-channel 515D accesses byte numbering 48-63, reordered from that of FIG. 5A. In this manner, a 64 byte transfer is equally distributed across each of the memory sub-channels while the byte numbers are reordered and assigned.

Referring now back to FIG. 6, the bytes may be reordered differently in other embodiments of the invention.

As discussed previously, to support micro tile memory access, SA shared address bits may be utilized along with I independent address bits while the Q sub-channel select bits and P sub-channel data address bits are utilized to address the physical bytes accessed by a cache-line. For a 64 byte cache-line, the sum of Q sub-channel select bits and P sub-channel data address bits is 6.

In FIG. 6, we indicate the P sub-channel data address bits as being A0-A8. On FIG. 6, the Q sub-channel select bits are labeled A10, A8 and any more there in between. In FIG. 6, the I independent address bits are labeled A9, A10, A16, A18, A24 and any more there in between. In FIG. 6, the SA shared address bits are labeled as A11, A15, A17, A19, A20, A25, A26, and Ax for example. Additional shared address bits may be used in between.

With the I independent address bits, the sub-channel addresses are independent within an address offset of each other. To make the sub-channels fully independent from each other, a complete duplication of the command and address from the memory controller to each sub-channel may be used but would significantly increase the memory controller pin count, the silicon area for input/output drivers, and the wire routing area needed over a host printed circuit board or motherboard. Instead, embodiments of the invention share one or more portions of the sub-channel address bits across all sub-channels and permit the remainder, I, to be independent for each sub-channel, as depicted in FIG. 6. A judicious choice of the I independent address bits can therefore provide increased bandwidth efficiency, balanced against the cost of duplicating I address signals to each sub-channel.

As discussed previously, the I independent address bits may be obtained in different manners including routing additional address lines to each memory sub-channel and/or using address overloading.

Figure 7A:
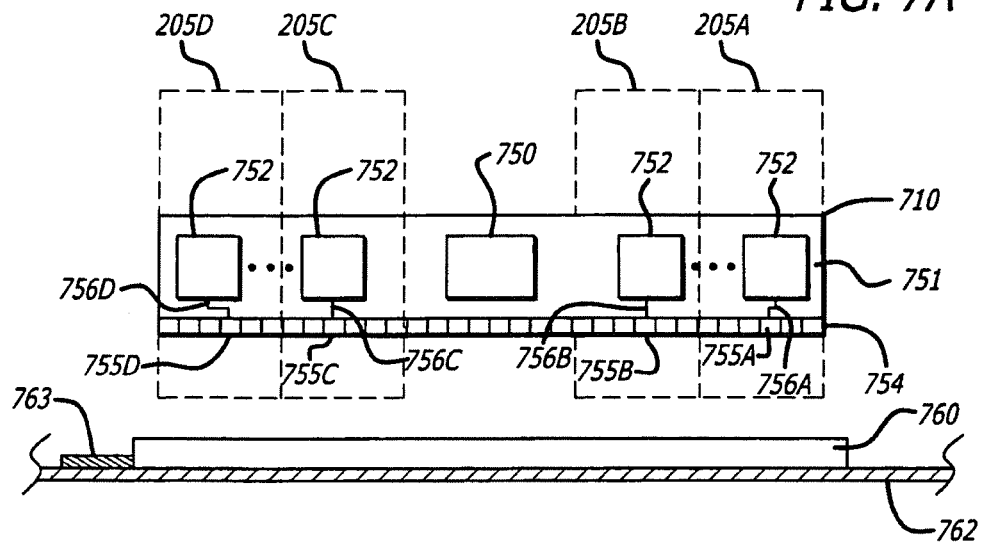
FIG. 7A illustrates a block diagram of a multi-chip memory module to couple to a connector mounted on a host printed circuit board.

Referring now to FIG. 7A, a memory module (MM) 710 is illustrated that is exemplary of the memory modules MM1-MMn. The memory module 710 may be of any type such as a SIMM or DIMM, for example. The memory module 710 includes memory integrated circuit chips ("memory devices") 752 coupled to a printed circuit board 751. The printed circuit board 751 includes an edge connector or edge connection 754 that couples to an edge connector 760 of a host printed circuit board 762.

To support micro-tiling of memory, additional address signal lines may be independently supplied to the memory integrated circuits 752 by using the unused or no-connect pins of the pinout of the edge connection 754 of the printed circuit board 751, in one embodiment of the invention. These unused or no-connect pins of the edge connection 754 may be used to route additional independent address signal lines to the memory integrated circuits 752. The same unused pins are found in the corresponding edge connector 760 mounted to the motherboard 762. Additional independent address signal lines 763 are routed across the motherboard 762 to the pre-existing connector from the memory controller in the memory control block to supply the additional independent address information. A number of different types of unused or no-connect pins of the pinout of the edge connection 754 of the memory module may be found.

For example, parity or an error correction code (ECC) function may have pins reserved as part of the pin-out for the edge connection 754. To lower the costs of memory modules to consumers, parity and ECC functions are often left off the memory module so that the reserved signal lines and pins often go unused. That is, the parity/ECC signal lines may be routed into all edge connectors of the motherboard, but are only used when ECC enabled memory modules (e.g., dual inline memory modules (DIMMs)) are installed therein. The unused pre-existing ECC lines/pins of the memory module are retargeted as independent address signal lines and used to implement micro-tiling in non-ECC memory modules. However in using the ECC lines/pins for micro-tiling, both ECC and micro-tiling functions cannot be enabled at the same time on a memory module. This solution works well in environments that don't typically need (or want) parity/ECC to be enabled.

As another example, optional active low data signal lines that are reserved in the pin-out for the edge connection 754 often go unused as they are redundant of the active high signal lines which are provided. As yet another example, optional test pins reserved within a pin-out for the edge connection 754 of the memory module often go unused as that test mode may not be used.

In any case, these unused pins are retargeted to be independent address signal pins 755A-755D and independent address signal lines 763 are routed on the host printed circuit board 762 and independent address signal lines 756A-756D are routed on the PCB 751 of the memory module 710 to the memory integrated circuits 752.

In some cases, the memory module 710 may further include a support integrated circuit 750 such as a buffer integrated circuit ("buffer") or an error correction control (ECC) integrated circuit. However as discussed previously, if ECC is not provided on the memory module 710, pins of the edge connection 754 that would have been otherwise reserved for ECC and are unused may be used for independent address lines into a memory sub-channel to support micro-tiling.

To support micro-tiling and independent addressing of memory sub-channels, the memory integrated circuits 752 on the memory model 710 may be divided up and assigned to the different memory sub-channels, such as the four memory sub-channels 205A, 205B, 205C, and 205D as illustrated in FIG. 7A. The data I/O of a memory integrated circuit 752 is typically 4, 8 or 16 bits wide. For a physical width of sixty-four bits for a memory channel and sixteen bits for each memory sub-channel, four sixteen bit wide memory integrated circuits 752 would be respectively assigned one-to-one to the four memory sub-channels 205A, 205B, 205C, and 205D. Eight eight-bit wide memory integrated circuits 752 would be respectively assigned two at a time to the four memory sub-channels 205A, 205B, 205C, and 205D to provide a physical width of sixty-four bits for a memory channel and sixteen bits each memory sub-channel. Sixteen four-bit wide memory integrated circuits 752 would be respectively assigned four at a time to the four memory sub-channels 205A, 205B, 205C, and 205D to provide a physical width of sixty-four bits for a memory channel and sixteen bits each memory sub-channel.

In the case of two memory sub-channels, four sixteen bit wide memory integrated circuits 752 would be respectively assigned two at a time to the two memory sub-channels for a physical width of sixty-four bits for a memory channel and thirty-two bits for each memory sub-channel. Eight eight-bit wide memory integrated circuits 752 would be respectively assigned four at a time to the two memory sub-channels for a physical width of sixty-four bits for a memory channel and thirty-two bits for each memory sub-channel. Sixteen four-bit wide memory integrated circuits 752 would be respectively assigned eight at a time to the two memory sub-channels for a physical width of sixty-four bits for a memory channel and thirty-two bits for each memory sub-channel.

By using the unused pins of the edge connection 754 of the memory module and a standard edge connector 760, the memory module 710 can be backward compatible with pre-existing memory subsystems. In another embodiment of the invention, a new edge connection 754 and a new edge connector 760 are provided with the added independent address signal lines to support micro-tiling memory. However in this embodiment of the invention, the memory module and edge connector are designed specifically to support micro-tiling of memory and are not backward compatible with pre-existing systems. In yet another embodiment of the invention, the memory integrated circuits are solder down to a mother board without using a memory module 710 or an edge connector 760.

Figure 7B:
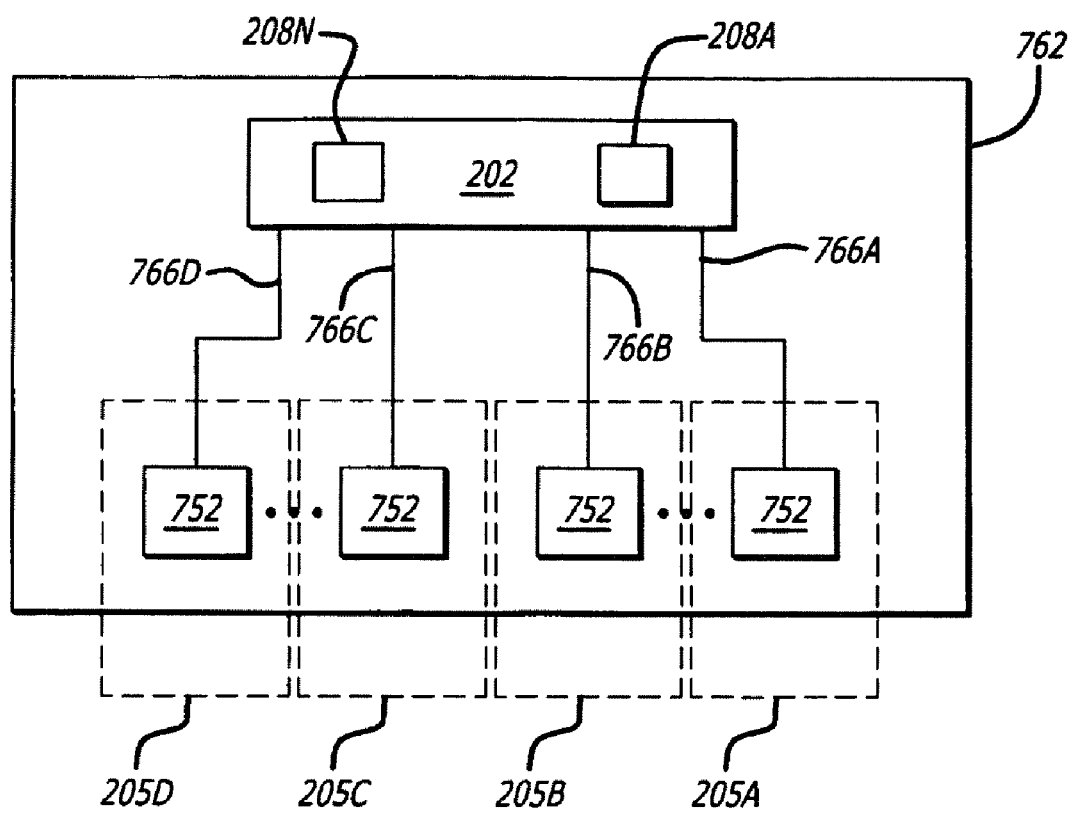
FIG. 7B illustrates a block diagram of a plurality of memory chips and memory controller embedded on a host printed circuit board.

Referring now to FIG. 7B, memory integrated circuits 752 are embedded onto the host printed circuit board 762 by being soldered directly thereto along with the memory control block 202 with the micro-tiled memory controllers 208A-208N, as well as other components, some of which were previously described and illustrated in FIGS. 2A-2B. At the expense of wire routing area on the host printed circuit board 762, independent address signal lines 766A-776D may be routed between a micro-tiled memory controller 208A-208N in the memory control block 202 and the memory integrated circuits 752. These independent address signal lines 766A-776D are not shared across memory integrated circuits 752 in different memory sub-channels 205A-205D. However, the independent address signal lines may be shared amongst the one or more memory integrated circuits 752 in the same memory sub-channel.

Consider FIG. 3A for example where four independent memory sub-channels are found in each memory channel. An additional independent four address lines may be provided per sub-channel to independently access an area of memory in each sub-channel. Address lines 311A-311D (labeled A9-A6) are independent within each sub-channel. Given that one set of four address lines pre-exists, the total number of additional address lines that are to be routed is three time four or twelve independent address signal lines. Routing additional signal lines works well when memory is soldered down onto the motherboard. Alternatively, routing additional signal lines over a motherboard to a memory module may be used to add the independent address signaling when the pinout of a pre-existing edge connector and memory module is not fully utilized. However, if the pinout of a pre-existing connector is being fully used, there is no room for additional lines and this method or routing additional signal lines is not as readily feasible, particularly if backward compatibility is desired.

Figure 8:
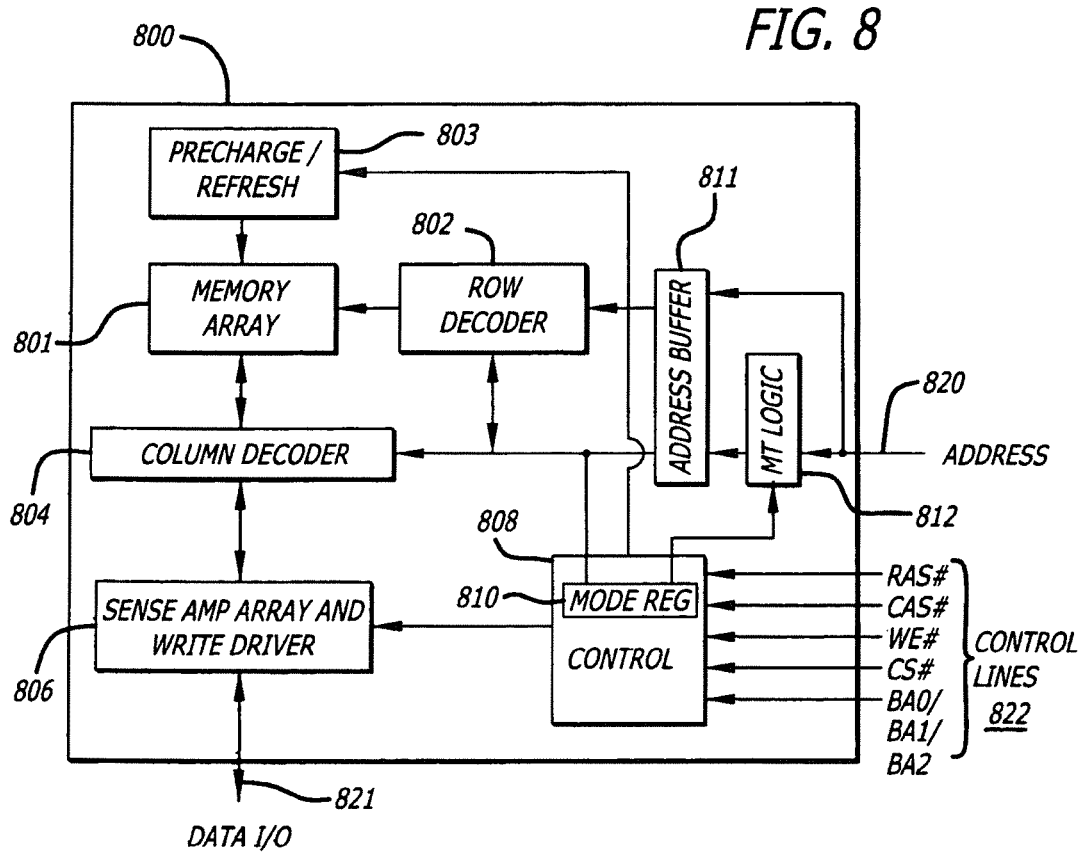
FIG. 8 illustrates a block diagram of a memory integrated circuit to support micro-tile memory accesses over memory sub-channels.

Referring now to FIG. 8, a block diagram of a memory integrated circuit 800 is illustrated. The memory integrated circuit 800 may be included in the memory modules MM1-MMn as the one or more memory devices 752. The memory integrated circuit 800 includes a memory array 801, a row address decoder 802, bitline precharge/refresh logic 803, a column decoder 804, a sense amp array and write driver block 806, a controller 808, an address buffer 811, and micro-tile control logic 812 coupled together as shown. The micro-tile control logic 812 may also be referred to as overload logic (OL).

The controller 808 includes a mode register 810 with a plurality of bits that can be set/initialized to control the general functionality of the memory integrated circuit 800. The mode register includes bit storage circuits to store the bits. The bits of the mode register 810 may be set by applying the appropriate bit settings on address lines 820 or data lines 821 coincident with a load strobe. The load strobe may be generated by toggling one or more of the control lines 822 that are coupled into the controller 808 of the memory integrated circuit when the memory is idle. The controller 808 receives one or more of the control lines 822. The one or more control lines 822 may include row address strobe RAS#, column address strobe CAS#, write enable WE#, chip select CS#, bank selects BA0, BA1, BA2, or other standard memory integrated control inputs.

More specifically, the mode register 810 may be used to configure the integrated circuit 800 for micro-tile memory access. As will be discussed further below, one of the bits of the mode register 810 is a micro-tile enable bit. The micro-tile enable bit may be active high and referred to as MTE bit. Alternatively, the micro-tile enable bit may be active low and referred to as MTE#. In either case, the micro-tile enable bit may generally be referred to as the micro-tile enable bit or the MTE bit. The micro-tile enable bit is reset by default such that micro-tiling is disabled when the device is initially powered-up or reset. This allows the memory module 710 and the memory integrated circuit 800 to be backward compatible when inserted into systems that do not support micro-tiling. The mode register 810 further has one or more sub-channel select (SCS) bits to indicate the memory sub-channel to which the memory integrated is assigned and addressable. The MTE bit and the one or more SCS bits are coupled into the micro-tile control logic 812.

The micro-tile control logic 812 is coupled to a plurality of address signal lines 820 so as to couple addresses to the column address decoder 804 and/or the row address decoder 802 through the address buffer 811. The address buffer 811 may latch the address signals on the internal address signal lines to hold them for the address decoders. The control logic 812 is also coupled to the mode register of the controller to receive the micro-tile enable bit and at least one sub-channel select bit in order to support micro-tile memory accesses into the memory array 801. In response to the micro-tile enable bit and the at least one sub-channel select bit, the control logic 812 selects one or more of the address signal lines over which to capture independent address information for a predetermined sub-channel to which it is assigned. That is, only a subset of the address signal lines may be assigned to a predetermined sub-channel. The control logic 812 selects this subset of address signal lines to extract the independent address information. Other address signal lines may be used for other sub-channels or some may be shared address signal lines into each sub-channel. The control logic 812 couples the independent address information into the column address decoder 804 and/or the row address decoder 802. The selection of the one or more address signal lines by the control logic may be further responsive to a column address load signal (CAS#) and a transaction enable signal.

Additional control logic may be added into and around the micro-tile control logic 812 in order to further swizzle the independent address information for one significant bit to another significant bit position. This is to provide a somewhat linear addressing method, such as for screen refresh, when micro-tiling is enabled.

The sense amp array and write driver block 806 couples to the data input/output (I/O) bus and may receive control signals from the controller 808 to read data from the memory array or write data into the memory array 801. The sense amp array and write driver block 806 receives data to be written into the memory array 801 and drives data out that has been read from the memory array 801 over the data input/output (I/O) bus 821. The data input/output (I/O) bus 821 includes bidirectional data lines of the memory integrated circuit 800 that are typically 4, 8 or 16 bits wide.

The memory array 801 consists of memory cells that may be organized in rows and columns. The memory cells are typically dynamic random access memory (DRAM) cells but can optionally be a static type of random access memory (SRAM) cell or a non-volatile programmable (NVRAM) type of re-writeable memory cell.

The row address decoder 802 receives a row address on the address lines and generates a signal on one of the word lines (WL) in order to address a row of memory cells in the memory array 801. The column decoder 804 also receives a column address on the address lines and selects which columns within the row of memory cells are to be accessed. The column decoder 804 essentially selects bitlines into memory cells that are to be accessed. In a read access, the column decoder 804 functions as a multiplexer. In a write access, the column decoder 804 functions as a de-multiplexer. The column address decoder 804 selectively accesses columns of memory cells within the memory array 801 in response to shared column address signals and if the micro-tile enable bit within the mode register is set, the column address decoder 804 selectively accesses columns of memory cells within the memory array 801 further in response to independent sub-channel column address signals.

The sense amp array and write driver block 406 may include sense amplifiers to determine whether a logical one or logical zero has been stored within the accessed memory cells during a read operation. The addressed memory cells try to drive a logical one or logical zero onto the selected bitlines of the memory array during the read operation. The sense amplifiers detect whether a logical one or logical zero has been driven out by the addressed memory cells onto the selected bitlines of the memory array during the read operation. The sense amp array and write driver block 406 may further include write drivers to drive a logical one or logical zero onto the selected bitlines of the memory array and into the addressed memory cells during a write operation.

The precharge/refresh block 803 couples to the bitlines in the memory array 801. The precharge/refresh block 803 may precondition the bitlines prior to addressing the memory cells during a read or write operation. The precharge/refresh block 803 may also refresh the data stored in the memory cells of the memory array 801 during periods of inactivity.

During specific memory cycles, some existing signal lines into the memory integrated circuit 800 are not used and can be re-targeted during this time for other purposes. For example during CAS (Column address strobe) cycles, not all the address lines are used. These unused address signal lines can be retargeted during the CAS cycle to communicate additional address information to the memory modules (e.g., DIMMs) and the memory integrated circuit devices therein. The memory controller 208 in the memory control block 202 sends additional address information over these unused address signal lines during the CAS cycle. The memory integrated circuit 800 with the added micro-tile control logic circuitry 812 and bits within the mode register 810 recognizes and decodes these overloaded signals on the previously unused address signal lines that were unused during the CAS cycles.

Figure 9A:
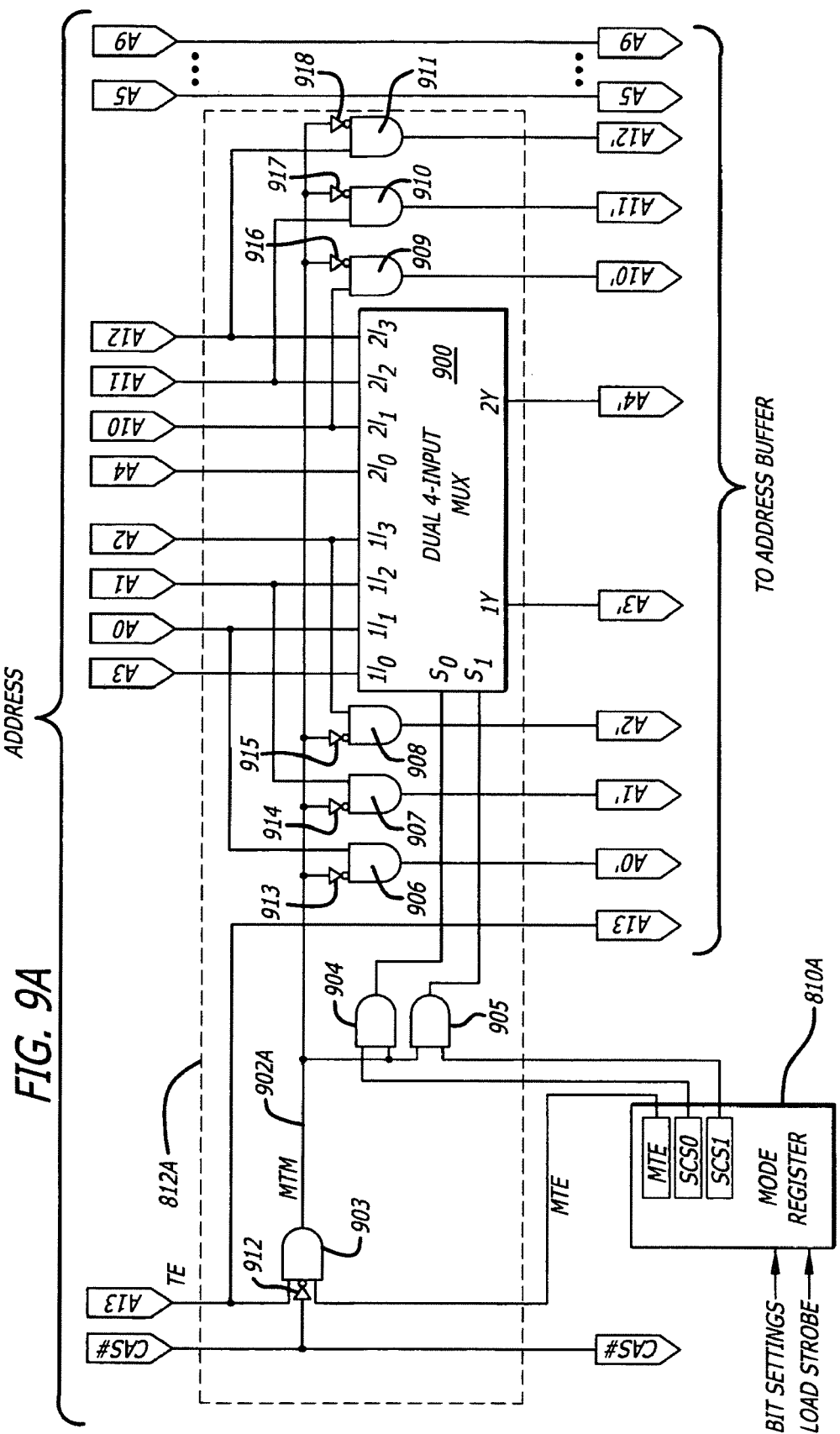
FIG. 9A illustrates a schematic diagram of address overload logic coupled to the mode register for a sixteen bit wide memory sub-channel and a sixteen byte memory access.

Referring now to FIG. 9A, to support micro-tiling exemplary micro-tile memory control logic 812A coupled to a mode register 810A within a memory integrated circuit is illustrated. The exemplary implementation of the micro-tile memory control logic 812A decodes overloaded address signal lines that have additional address information provided during unused memory cycles, such as a CAS cycle. The schematic diagram of the micro-tile memory control logic 812A assumes that four sub-channels are provided each of which has a logical width of sixteen bytes to support micro-tiling.

Central to the micro-tile memory control logic 812A is a dual four input multiplexer 900 to capture the independent address information. The dual four input multiplexer 900 of the micro-tile memory control logic 812A selectively outputs shared column address signals or independent sub-channel column address signals on the multiplexed output (A3' and A4'). The outputs (A3' and A4') of the dual four input multiplexer are coupled to the input of the column address decoder. The independent sub-channel column address signals are the one or more independent column address signals that have been selected to be received by the respective memory sub-channel.

The micro-tile control logic 812A receives the address lines from address pins of the memory integrated circuit. The micro-tile control logic 812A provides addresses to the address buffer to be distributed to the row address decoder and the column address decoder. Some of the address pins of the memory integrated circuit receive shared row address signals, shared column address signals, independent column address signals, or a combination thereof. For example, address pins A5-A9 and A13 pass around the micro-tile control logic 812A and may receive shared row address signals and/or shared column address signals into each of the memory sub-channels. Address pins A0-A4 and A10-A12 are coupled into the dual four input multiplexer 900 and may receive shared row address signals and independent column address signals if micro-tiling is enabled. If micro-tiling is not enabled, address pins A3 and A4, coupled into the dual four input multiplexer 900, may receive shared row address signals and/or shared column address signals. A column address load strobe pin CAS# is coupled to the control logic 812A to receive a column address load strobe signal and selectively receive the appropriate one or more of the independent column address signals on the address pins assigned to a given sub-channel for capture inside the memory integrated circuit.

The column address load strobe signal may also be used to receive and capture the shared column address signals off of the appropriate address pins.

The mode register 810A may include three bit storage circuits such as a flip flop or memory cell to store settings of a micro-tile enable (MTE) bit, a sub-channel select bit zero (SCS0) bit, and a sub-channel select bit one (SCS1) bit. These three bits in the mode register 810A are programmed with the appropriate sub-channel select bits and micro-tile enable bits. These three bits are set/reset from bit settings that the memory integrated circuit receives during initialization such as at power-up or reset. These three bits may also be set/reset when the memory integrated circuit is idle with no memory access in progress. The bit settings may be received over the address or data signal lines and loaded into the mode register in response to a load strobe signal generated by one or more control line inputs coupled into the memory integrated circuit. If micro-tiling is to be enabled in the memory integrated circuit, the micro-tile enable bit MTE is set. As the MTE bit is active high, it is set to a high logic level. If active low, the MTE# bit is set to a logic low level. In the exemplary control logic of FIG. 9A, there are possibly four or less sub-channels within a memory channel. The SCS0 and SCS1 bits assign the memory integrated circuit to one of four memory sub-channels. Other memory integrated circuits on the same memory module may be assigned to another one of the four memory sub-channels.

Independent address information for each of the sub-channels is made available over the pre-existing address lines, such as address lines A0-A4 and A10-A12, during the CAS cycle. In this example, address lines A3 and A4 are ordinarily used. Thus, address lines A0, A1, A2, A10, A11, A12, and A13 are overloaded signal lines (A13 may be the micro-tile transaction enable—specified on a transaction basis). This method of overloading signal lines on existing address lines in effect provides six additional address lines (A0-A2 and A10-A12) to the memory integrated circuit devices without the use of additional traces (i.e., wire routing) or the use of additional pins.

The micro-tile memory control logic 812A is provided in each memory integrated circuit so that proper independent sub-channel address information is selected from the address lines A0-A4 and A10-A12 in response to the sub-channel select bits stored in the mode register. The settings of the sub-channel select bits are routed from the mode register 810A to the micro-tile memory control logic 812A to control the input selection process of the multiplexer 900. The output terminals of the multiplexer 900 are coupled to address signal lines A3' and A4'. Address signal lines A3' and A4' are coupled to an address decoder (e.g., column address decoder 804) to select memory cells within the memory array.

The micro-tile control logic may overload the memory address signal lines A3' and A4' during the column address write access time when CAS# is active low ("CAS cycle"). That is, address bits A0, A1, A2, A10, A11 and A12 are normally unused address bits when the column address is being written to the memory integrated circuit without micro-tiling. Address bits A3 and A4, substituted by A3' and A4', are address bits that are used to write the column address to the memory integrated circuit. While address bits are normally unused without micro-tiling during the CAS cycle, they may be used to select the row address in a memory integrated circuit when the row address is being written into the memory integrated circuit when RAS# is active low ("RAS cycle"). This is referred to herein as address overloading. While A0, A1, A2, A10, A11 and A12 are illustrated as being the unused address bits during column address strobe CAS# in FIG. 9A, different unused address bits may be utilized as the overloaded address signal lines to support micro-tiling.

The micro-tile memory control logic 812A includes the dual four input multiplexer 900, a three input AND gate 903, a plurality of two input AND gates 904-911, and a plurality of inverters 912-918 coupled together as shown. It is well understood that an AND gate may be formed by the combination of a NAND gate with an inverter having its coupled to the output of the NAND gate.

The dual four-input multiplexer 900 is a pair of four to one multiplexers each having a first select control input S0 coupled together and a second select control input S1 coupled together. The first four to one multiplexer receives inputs 1I0-1I3 and provides the output 1Y in response to the select control inputs S0 and S1. The second four to one multiplexer receives inputs 2I0-2I3 and provides the output 2Y in response to the select control inputs S0 and S1. If S0 and S1 are both logical low or zero, the inputs 1I0 and 2I0 are multiplexed onto the respective outputs 1Y and 2Y. If S0 is a logical high or one and S1 is a logical low or zero, the inputs 1I1 and 2I1 are multiplexed onto the respective outputs 1Y and 2Y. If S0 is a logical low or zero and S1 is a logical high or one, the inputs 1I2 and 2I2 are multiplexed onto the respective outputs 1Y and 2Y. If S0 and S1 are both logical high or one, the inputs 1I3 and 2I3 are multiplexed onto the respective outputs 1Y and 2Y.

The first four-input multiplexer of the dual four-input multiplexer 900 receives the address bits A3, A0, A1, and A2 at its respective 1I0-1I3 inputs and selects one of them to be driven onto the address signal line A3' at its 1Y output. The second four-input multiplexer receives address bits A4 and A10-A12 at its respective 2I0-2I3 inputs and selects one of them to be driven onto the address signal line A4' at its 2Y output. The select control inputs S0 and S1 are respectively coupled to the outputs of the AND gates 904-905.

The AND gate 903 generates a micro-tile mode signal (MTM) 902A at its output. The micro-tile mode signal 902A is active high and generated at the appropriate time when the independent address signals are on the overloaded address signal lines coupled into the dual four-input multiplexer 900. Inverter 912 inverts the active low CAS# signal into an active high CAS signal at its output which is coupled into an input of the AND gate 903. AND gate 903 logically ands the CAS signal, the MTE bit setting (ME), and the transaction enable signal (TE, address bit A13) to generate the micro-tile mode signal 902A. That is if micro-tile is enabled by the MTE bit and the transaction is enabled by the TE signal, the micro-tile mode signal (MTM) 902A is generated when CAS# goes low.

The micro-tile mode signal (MTM) 902A is coupled into the inputs of AND gates 904 and 905 to gate the sub-channel select bits SCS0 and SCS1. If the micro-tile mode signal (MTM) 902A is low for any reason, the select controls S0 and S1 into the multiplexer 900 are logically low or zero at the output of the AND gates 904 and 905. With S0 and S1 being both logical low or zero, the address bits A3 and A4 respectively coupled to the inputs 1I0 and 2I0 are respectively multiplexed onto the address signal lines A3' and A4' at the respective outputs 1Y and 2Y. Bits A3 and A4 merely pass through to signal lines A3' and A4' respectively. This is the default condition if micro-tiling is not enabled or if bits A3 and A4 are used for any other purpose, such as row addressing.

When the micro-tile mode signal (MTM) 902A is active high, the sub-channel select bits SCS0 and SCS1 are respectively coupled into the select control inputs S0 and S1 of the multiplexer 900 by passing through the AND gates 904 and 905, respectively. Thus, when the micro-tile mode signal (MTM) 902A is generated to be active high by the AND gate 903, the sub-channel select bits SCS0 and SCS1 control the selection of the multiplexing of the respective four inputs to the respective outputs of the multiplexer 900. Effectively the settings of the sub-channel select bits SCS0 and SCS1, indicating the sub-channel to which the memory IC may be assigned, determines which address bit lines coupled into the multiplexer 900 are used to capture the independent address signals during the CAS cycle.

The settings of the sub-channel select bits SCS0 and SCS1 will vary from one sub-channel to the next. For four sub-channels, there are four different settings for SCS0 and SCS1 respectively. Note however that micro-tile control logic designed to support four sub-channels can be readily reduced to support two sub-channels by using only two different settings of the sub-channel select bits SCS0 and SCS1. With the different settings for SCS0 and SCS1, the multiplexer 900 selects different address signal lines to capture the independent address signals when the micro-tile mode signal is generated.

The micro-tile mode signal (MTM) 902A is also coupled into the inverters 913-918 at a first input to the AND gates 906-911, respectively. The address signals A0, A1, A2, A10, A11, and A12 are respectively coupled into the second input of the AND gates 906-911. The micro-tile mode signal (MTM) 902A effectively gates the signals on the address lines A0, A1, A2, A10, A11, and A12 into the memory integrated circuit respectively at the outputs A0', A1', A2', A10', A11', and A12' of the AND gates 906-911. That is, when the micro-tile mode signal (MTM) 902A is logically low or zero, the AND gates 906-911 allow the signals on address lines A0, A1, A2, A10, A11, and A12 to pass through onto the outputs A0', A1', A2', A10', A11', and A12' and to the address decoders. When the micro-tile mode signal (MTM) 902A is logically high or one, the AND gates 906-911 drive all the outputs A0', A1', A2', A10', A11', and A12' to logical low or zero. Thus when the micro-tile mode signal (MTM) 902A is active high to capture the independent address information, the outputs A0', A1', A2', A10', A11', and A12' are not used as they are all driven to zero.

Figure 9B:
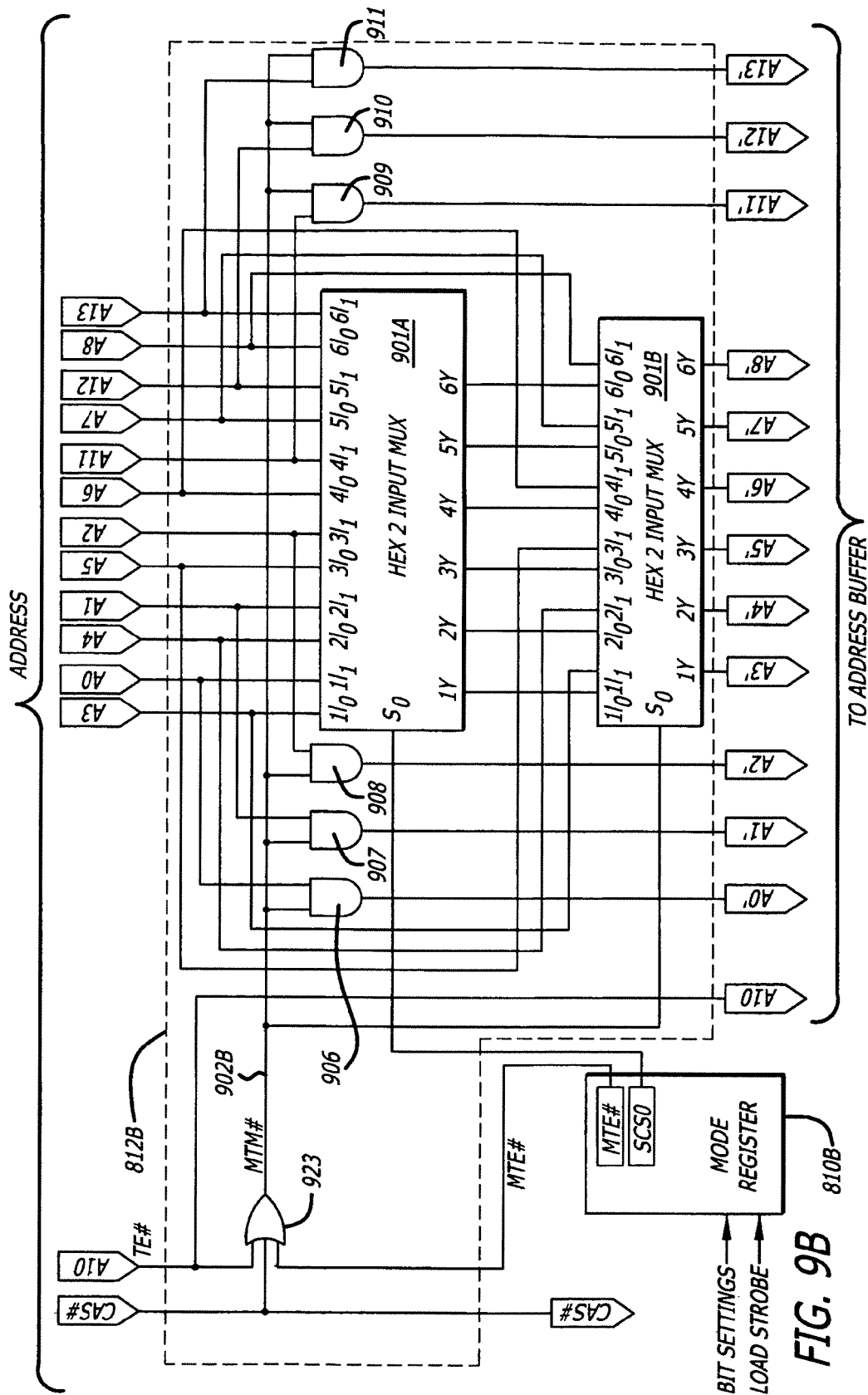
FIG. 9B illustrates a schematic diagram of address overload logic coupled to the mode register for a thirty-two bit wide memory sub-channel and a thirty-two byte memory access.

Referring now to FIG. 9B, to support micro-tiling a mode register 810B coupled to micro-tile control logic 812B within a memory integrated circuit is illustrated. The micro-tile control logic 812B functions somewhat similar to the micro-tile control logic 812A, but for the use of active low control signaling and the support of two sub-channels within a memory channel. The circuitry in the micro-tile control logic 812B has been formed to reduce delays in the selection of the independent address signals on the address signal lines through the select control inputs of the multiplexers. With two memory sub-channels to support, the micro-tile control logic 812B receives two independent sets of address signals on the address signal lines from which to choose to receive. Central to the micro-tile memory control logic 812B is a hex two-input multiplexer 901A to capture the independent address information from the address signal lines. The hex two-input multiplexer 901A in the micro-tile control logic 812B receives more and different address signal lines on which independent sets of address signals may be selectively received. That is, the number of I independent address bits illustrated in FIG. 6 is greater. As a result, the independently addressable memory space within a memory sub-channel is greater.

The micro-tile control logic 812B is coupled to the address pins of the memory integrated circuit including address pins A0-A8 and A10-A13. Independent address information for each of the sub-channels is made available over these pre-existing address lines during the CAS cycle. The micro-tile control logic selectively forms the independent sub-channel address signals on the internal address signal lines A3'-A8'. The internal address signal lines A0'-A8' and A11'-A13' are coupled to the address decoders through the address buffer. The address buffer may latch the address signals on the internal address signal lines A0'-A8' and A11'-A13' and A9-A10 in response to the RAS# and CAS# strobe signals and then couple the address signals to the address decoders. Address pins A0-A8 and A10-A13 have overloaded address signals during unused memory cycles and are coupled to the inputs of the hex two-input multiplexer 901A as shown. Address signal lines A3-A8 is a first set of address signal lines over which a first set of independent address signals may be coupled into a first memory sub-channel. Address signal lines A0-A2 and A11-A13 is a second set of address signal lines over which a second set of independent address signals may be coupled into a second memory sub-channel. In response to a first sub-channel select bit (SCS0) and a micro-tile mode signal (MTM#) 902B, the micro-tile control logic 812B generally selects between receiving the first set of independent address signals for a first memory sub-channel or the second set of independent address signals for a second memory sub-channel. The selected set of independent address signals is provided at the output of the hex two-input multiplexer 901A. These independent address signals are coupled into the memory integrated circuit to independently address different memory locations within a set of common memory locations formed by the SA shared address bits that may be coupled into each memory sub-channel.

Independent address information for each of the sub-channels is made available over the pre-existing address lines, such as address lines A0-A4 and A10-A12, during the CAS cycle. In this example, address lines A3-A8 are ordinarily used. Thus, address lines A0-A2, and A10-A12 are overloaded signal lines (A13 may be the micro-tile transaction enable—specified on a transaction basis). This method of overloading signal lines on existing address lines in effect provides six additional address lines (A0-A2 and A10-A12) to the memory integrated circuit devices without the use of additional traces (i.e., wire routing) or the use of additional pins.

The mode register 810B may include two bit storage circuits such as a flip flop or memory cell to store settings of an active low micro-tile enable bit MTE# and a sub-channel select bit zero (SCS0). The mode register receives bit settings for these two bits. The bit settings are loaded into the mode register using a load strobe signal generated by one or more control signals. These three bits are set/reset from bit settings that the memory integrated circuit receives during initialization such as at power-up or reset. These three bits may also be set/reset when the memory integrated circuit is idle with no memory access in progress. The bit settings may be received over the address or data signal lines and loaded into the mode register in response to a load strobe signal generated by one or more control line inputs coupled into the memory integrated circuit.

The MTE# bit and the SCS0 bit in the mode register 810A are programmed with the appropriate sub-channel select bit and micro-tile enable bit. If micro-tiling is to be enabled in the memory integrated circuit, the micro-tile enable bit (MTE#), an active low signal, can be set to a logic low level. The micro-tile enable bit is set when the memory sub-system supports micro-tiling. Otherwise the micro-tile enable bit is not set so that the memory integrated circuit is backward compatible with older systems that do not support micro-tiling. In the exemplary control logic of FIG. 9B, there are two possible sub-channels within a memory channel. The SCS0 bit assigns the memory integrated circuit to one of the two memory sub-channels within the memory channel. Other memory integrated circuits on the same memory module may be assigned to the other memory sub-channel.

The micro-tile memory control logic 812B is provided in each memory integrated circuit so that proper independent sub-channel address information may be selected from the address signal pins in response to the sub-channel select bit(s) stored in the mode register. The settings of the sub-channel select bit(s) are routed from the mode register to the micro-tile memory control logic to control the input selection process of the multiplexer 901A.

The micro-tile control logic 812B includes a first hex two-input multiplexer 901A, a second hex two-input multiplexer 901B, a plurality of AND gates 906-911, a plurality of inverters 913-918, and a three-input OR gate 923 coupled together as illustrated in FIG. 9B. It is well understood that an OR gate may be formed by coupling the input of an inverter to the output of a NOR gate. The well known formation of an AND gate was previously provided.

The outputs of the first hex two-input multiplexer 901A are coupled into the first of the two inputs of each of the multiplexers in the second hex two-input multiplexer 901B. The address bits or signal lines A3, A4, A5, A6, A7, and A8 are coupled into the second of the two inputs of each of the multiplexers in the second hex two-input multiplexer 901B. The output terminals of the second hex two-input multiplexer 901B are coupled to address signal lines A3'-A8'. Address signal lines A3'-A8' are coupled to an address decoder (e.g., column address decoder 804) to select memory cells within the memory array. An address buffer may latch or register the address signal lines A3'-A8' to hold there states so that they can be decoded by the address decoder.

The first hex two-input multiplexer 901A has its select control S0 coupled to the sub-channel select zero (SCS0) bit such that the output of the multiplexer 901A is directly controlled by the sub-channel assignment of the memory integrated circuit. In this manner the selected outputs are well settled to minimize propagation delay of the address signals. The second hex two-input multiplexer 901B has its select control input S0 coupled to the output of the three input OR gate 923, the active low micro-tile mode (MTM#) signal 902B. If the active low micro-tile mode (MTM#) signal 902B is logically low or zero, micro-tiling memory accesses are enabled such that the outputs of the first hex two-input multiplexer 901A are the respective logical outputs of the second hex two-input multiplexer 901B on address signal lines A3'-A8'. If micro-tiling access is not enabled, MTM# is high such that the second of the two inputs of each of the multiplexers in the second hex two-input multiplexer 901B is selected and the address signal lines A3-A8 are coupled onto the independent sub-channel column address lines A3'-A8'. In this case, the first hex 2 input multiplexer 901A has no effect on the address signals A3-A8 which are effectively routed around the micro-tile control logic 812B and driven onto the internal address lines A3'-A8', respectively.

The hex two-input multiplexers 901A-901B are six two-to-one multiplexers having a select control input S0 coupled together. The first two to one multiplexer receives inputs 1I0 and 1I1 and provides the output 1Y in response to the select control input S0. The second two to one multiplexer receives inputs 2I0 and 2I1 and provides the output 2Y in response to the select control input S0. The third two to one multiplexer receives inputs 3I0 and 3I1 and provides the output 3Y in response to the select control input S0. The fourth two to one multiplexer receives inputs 4I0 and 4I1 and provides the output 4Y in response to the select control input S0. The fifth two to one multiplexer receives inputs 5I0 and 5I1 and provides the output 5Y in response to the select control input S0. The sixth two to one multiplexer receives inputs 6I0 and 6I1 and provides the output 6Y in response to the select control input S0. If S0 is a logical low or zero, the inputs 1I0, 2I0, 3I0, 4I0, 5I0, and 6I0 are respectively driven onto the outputs 1Y, 2Y, 3Y, 4Y, 5Y, and 6Y. If S0 is a logical high or one, the inputs 1I1, 2I1, 3I1, 4I1, 5I1, and 6I1 are respectively driven onto the outputs 1Y, 2Y, 3Y, 4Y, 5Y, and 6Y.

As discussed previously, the three input OR gate 923 generates the active low micro-tile mode (MTM#) signal 902B at its output. At its inputs, the three input OR gate 923 receives the micro-tile enable bit MTE#, the column address strobe CAS# signal, and the transaction enable bit TE# (address line A10). If all of these three inputs are low logic levels or zeroes, the micro-tile mode (MTM#) signal 902B is logically low or zero to selectively receive independent sub-channel address signals from the overloaded address lines. This requires that micro-tiling be enabled by the micro-tile enable bit being set to its active low level or zero; the micro-tile transaction is enabled by the address line A10 being set to logical low or zero; and the column addresses are to be strobed into the memory integrated circuit by the CAS# control signal being strobed to a logical low or zero. That is, all these input signals are active low into the control logic 812B for micro-tiling memory accesses. If any one of the inputs MTE#, CAS#, or TE# are a logical high or one, micro-tile mode (MTM#) signal 902B is logically high or a one. With the micro-tile mode (MTM#) signal 902B being logically high or a one, the second hex two-input multiplexer 901B of the control logic 812B passes through the address signals A3-A8 onto the internal address lines A3'-A8' as normal, without selecting any independent sub-channel address signal information. Requiring more than one signal to enable micro-tile accesses provides assurances that the micro-tile mode will not be entered by mistake through an error in only one bit signal.

The AND gates 906-911 in the control logic 812B operate similarly to AND gates 906-911 in control logic 812A but gate different address signals and can do so without the inverters 913-918 as the micro-tile mode (MTM#) signal 902B is an active low signal. Thus, AND gates 906-911 in the control logic 812B gate the address signals A0-A2 and A11-A12 to zero on the internal address lines A0'-A2' and A11'-A12', respectively, in the response to the micro-tile mode (MTM#) signal 902B being active low.

Figure 9C:
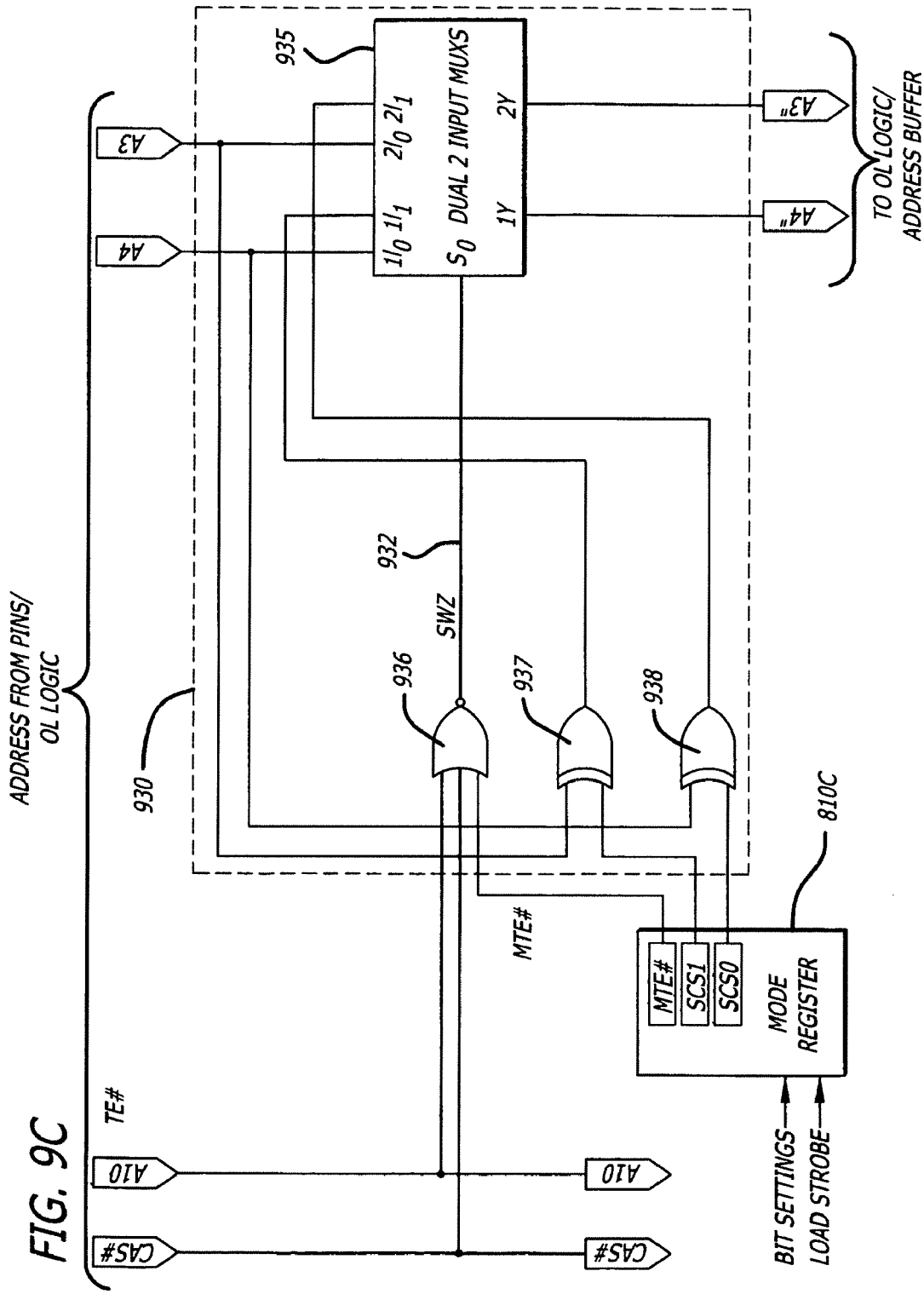
FIG. 9C illustrates a schematic diagram of swizzle logic for a thirty-two bit wide memory sub-channel and a thirty-two byte memory access.

Referring now to FIG. 9C, a schematic diagram of address swizzle logic 930 is illustrated coupled to a mode register 810C. The address swizzle logic 930 illustrated in FIG. 9C is for a memory channel having two memory sub-channels. The swizzle control logic may be appended before or after the overload or micro-tile control logic 812A or 812B illustrated in FIGS. 9A and 9B.

Briefly, the address swizzle logic 930 is provided so that a somewhat linear addressing capability is possible with the micro-tiled memory controllers, such as may be desired during a screen refresh. The address swizzle logic 930 selectively reorders or transposes the significance of the address bits received from the memory controller. One way of doing this is to swap bit positions. Another way that this may be accomplished is to selectively invert the address bits.

The address swizzle logic 930 includes a dual two-input multiplexer 935, a NOR gate 936, and exclusive OR (XOR) gates 937-938 coupled together as shown. The dual two-input multiplexer 935 includes a pair of two input multiplexers with their select control inputs S0 coupled together and to the swizzle control signal (SWZ) 932 that is output from the NOR gate 936. The address bits or pins A4 and A3 are respectively coupled to the 1I0 and 2I0 inputs of the multiplexer 935 and selected to be output when the select control input S0 is logically low or zero. The outputs of the XOR gates 937-938 are respectively coupled to the 1I1 and 2I1 inputs of the multiplexer 935 and selected to be output when the select control input S0 is logically high or one.

The sub-channel select bit one (SCS1) and the sub-channel select bit zero (SCS0) are respectively coupled into a first input of the exclusive-OR (XOR) gates 937-938. Address bits A3 and A4 are respectively coupled into the second input of the XOR gates 937 and 938. If the SCS1 bit is set to one, the XOR gate 937 inverts the address bit A3 at its output that is coupled into 1I1 of the multiplexer 935. If the SCS0 bit is set to one, the XOR gate 938 inverts the address bit A4 at its output that is coupled into 2I1 of the multiplexer 935. In this manner, the settings of the SCS1 and SCS0 bits may effectively invert the address signals on the address bit lines A3 and A4.

The NOR gate 936 generates the swizzle control signal (SWZ) 932 at its output that is coupled into the select control input S0 of the dual two-input multiplexer 935. The swizzle control signal (SWZ) 932, an active high signal, selects whether or not the swizzled address bits are selected to be output from the dual two-input multiplexer 935. If the swizzle control signal (SWZ) 932 is logically high or one and coupled into the select control input S0 of the dual two-input multiplexer 935, the swizzled address bits output from the XOR gates 937 and 938 are selected to be driven onto the respective address lines A4" and A3" at the output of the multiplexer 935. This occurs if micro-tiling is enabled by the active low micro-tile enable bit MTE#, CAS# strobe signal is logically low to capture column address information, and the TE# bit is logically low to enable a micro-tile transaction that are input into the NOR gate 936. However, if the swizzle control signal (SWZ) 932 is logically low or zero coupled into the select control input S0 of the dual two-input multiplexer 935, the address bits A4 and A3 pass through onto the respective address lines A4" and A3" at the output of the multiplexer 935 without swizzling. This may occur if micro-tiling is not enabled by the active low micro-tile enable bit MTE#, or if the CAS# strobe signal is not logically low to capture column address information, or if the TE# bit is not logically low to enable a micro-tile transaction.

The mode register 810C is similar to mode register 810B but stores the setting of the additional bit (SCS1). The mode register 810C includes three bit storage circuits such as a flip flop or memory cell to store settings of the active low micro-tile enable bit MTE#, the sub-channel select bit zero (SCS0), and the sub-channel select bit one (SCS1). The mode register receives bit settings for these bits. The bit settings are loaded into the mode register using a load strobe signal generated by one or more control signals. These three bits are set/reset from bit settings that the memory integrated circuit receives during initialization such as at power-up or reset. These three bits may also be set/reset when the memory integrated circuit is idle with no memory access in progress. The bit settings may be received over the address or data signal lines and loaded into the mode register in response to a load strobe signal generated by one or more control line inputs coupled into the memory integrated circuit.

As it may be important to maintain address signal delay as small as possible, the address swizzling logic of FIG. 9B may be combined with the overload logic illustrated in FIG. 9C and simplified to reduce signal delay on the internal address signal lines.

Figure 9D:
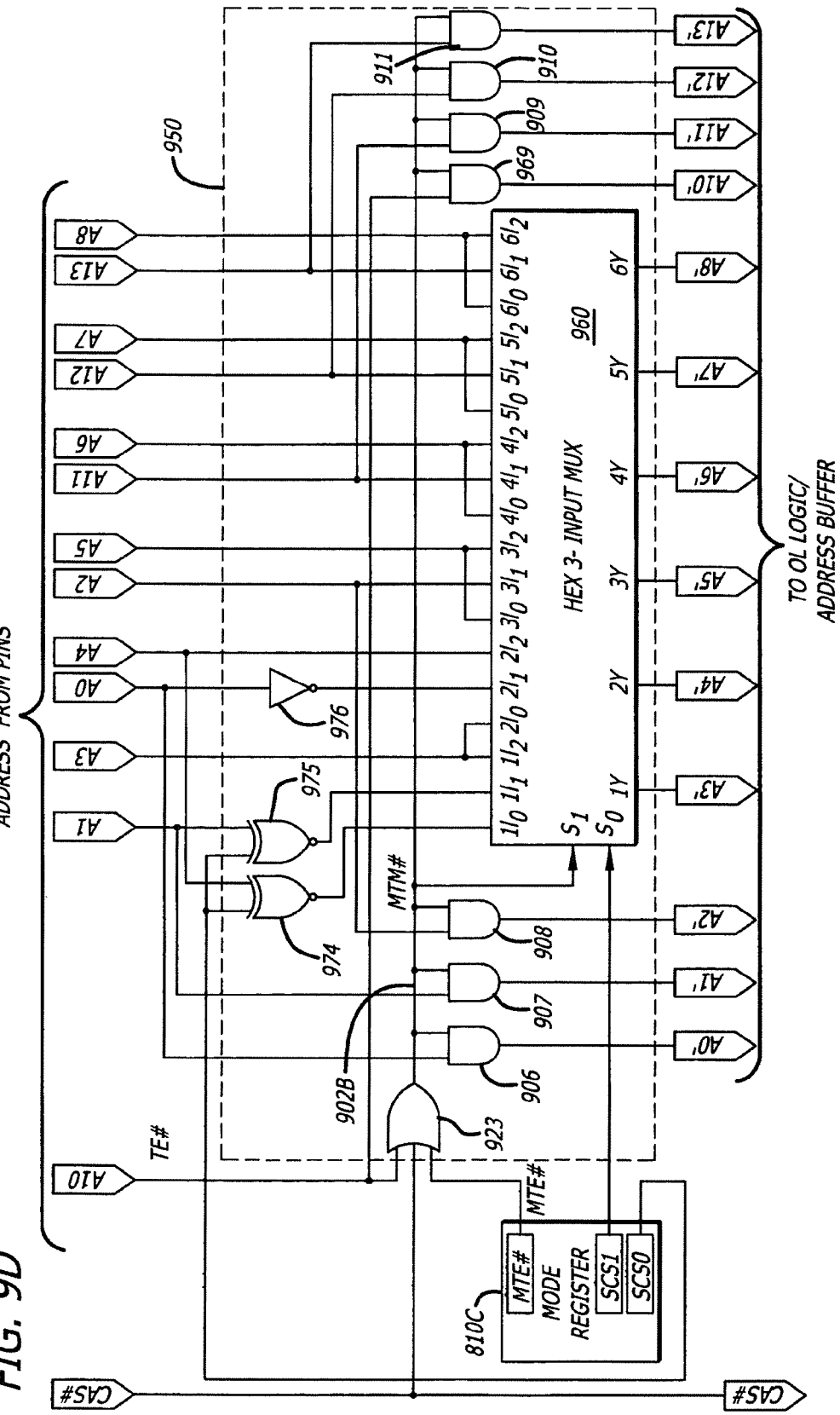
FIG. 9D illustrates a schematic diagram of simplified logic combining the address overload logic of FIG. 9B and the swizzle logic of FIG. 9C together for a thirty-two bit wide memory sub-channel and a thirty-two byte memory access.

Referring now to FIG. 9D, combined swizzle and micro-tile control logic 950 coupled to the mode register 810C in a memory integrated circuit is illustrated. The control logic 950 combines and simplifies the address swizzle logic 930 of FIG. 9C with the overload or micro-tile control logic 812B of FIG. 9B. Thus, the combined swizzle and micro-tile control logic 950 functions similar to the separate components of the micro-tile control logic 812B and the address swizzle logic 930. The goal of the simplification in the control logic 950 is to reduce the time delay in the address signal path to the address decoders and address buffer in the memory integrated circuit. The pair of hex two input multiplexers 901A and 901B have been simplified down to a single hex three-input multiplexer 960.

The mode register 810C is as previously described including the active low micro-tile enabled bit (MTE#), the SCS0 bit, and the SCS1 bit. The mode register bits may be loaded from bit settings with a load strobe generated from control signals coupled into the memory integrated circuit.

The control logic 950 includes the hex three-input multiplexer 960, AND gates 906-910, OR gate 923, AND gate 969, exclusive NOR (XNOR) gates 974-975, and an inverter 976 coupled together as shown. The exclusive NOR (XNOR) gates 974-975 may alternatively be exclusive OR (XOR) gates with the bits settings of SCS0 and SCS1 being inverted. The control logic 950 is coupled to the address pins A0-A8 and A10-A13 to receive the address signals and generate the internal address signaling on address signal lines A0'-A8' and A10'-A13'. Address signal input A10 performs double duty as the transaction enable bit TE# in a micro-tile mode and as the address input signal.

In the control logic, the address signal lines from the address pins may first be coupled into address swizzle logic before being coupled to inputs of the hex 3-input multiplexer 960. For example, address A4 is coupled into an input of the XNOR gate 974, address A1 is coupled into the XNOR gate 975, and address A0 is coupled into the inverter 976. If the SCS0 bit is set to a logical low or zero, the XNOR gates 974-975 invert the respective address signals A4 and A1 prior to being respectively coupled into the 1I0 and 1I1 inputs of the multiplexer 960. If the SCS0 bit is set to a logical high or one, the XNOR gates 974-975 pass the respective address signals A4 and A1 without inversion which are then coupled into the 1I0 and 1I1 inputs of the multiplexer 960, respectively.

The hex three-input multiplexer 960 has six three-to-one multiplexers having a first select control input S0 coupled together and a second select control input S1 coupled together. The first three-to-one multiplexer receives inputs 1I0, 1I1, and 1I2 and provides the output 1Y in response to the select control inputs S0 and S1. The second three-to-one multiplexer receives inputs 2I0, 2I1, and 2I2 and provides the output 2Y in response to the select control inputs S0 and S1. The third three-to-one multiplexer receives inputs 3I0, 3I1, and 3I2 and provides the output 3Y in response to the select control inputs S0 and S1. The fourth three-to-one multiplexer receives inputs 4I0, 4I1, and 4I2 and provides the output 4Y in response to the select control inputs S0 and S1. The fifth three-to-one multiplexer receives inputs 5I0, 5I1, and 5I2 and provides the output 5Y in response to the select control inputs S0 and S1. The sixth three-to-one multiplexer receives inputs 6I0, 6I1, and 6I2 and provides the output 6Y in response to the select control inputs S0 and S1.

The hex three-input multiplexer 960 has the first select control input S0 and the second select control input S1 to select which of the three inputs are to coupled to the respective outputs. As it possible with two select control inputs to select one of four, the truth table for the hex 3-input multiplexer will now be described. If both select bits S0 and S1 are set to zero, the I0 inputs are selected to be output from the multiplexer. If the S0 bit is set to 1 and the S1 bit is set to zero, the I1 inputs are selected to be output from the multiplexer. If the S1 bit it set to one, the I2 inputs are selected to be output from the multiplexer regardless of the bit setting for S0. That is, in this last case, S0 input into the hex 3-input multiplexer is a don't care when the S1 bit is set to one as it is over-riding.

As discussed previously, OR gate 923 generates an active low micro-tile mode signal (MTM#) 902B. The active low micro-tile mode signal (MTM#) 902B is coupled into the second select control input S1 of the multiplexer 960. The respective I2 inputs into the multiplexer 960 are the address bits A3-A8. The respective I1 inputs into the multiplexer 960 are the output from XNOR gate 975, the output from inverter 976, and address bits A2, A11, A12, and A13, respectively. The respective I0 inputs into the multiplexer 960 are the output from XNOR gate 974, and address bits A3, A5, A6, A7, and A8, respectively.

As discussed previously, the micro-tile mode signal (MTM#) 902B is an active low signal. However if the micro-tile mode signal (MTM#) 902B is logically high or a one, the I2 inputs are selected to be output from the multiplexer regardless of the bit setting for the first select control input S0. That is, the I2 inputs (address bits A3-A8) are selected to be passed through the multiplexer 960 and driven out onto the internal address signal lines A3'-A8', if the micro-tile mode signal (MTM#) 902B is high or a one.

If the micro-tile mode signal (MTM#) 902B is generated to be an active low signal by the input conditions to the OR gate 923, the SCS1 bit coupled into the first select control input of multiplexer selects either the I0 inputs or the I1 inputs into the multiplexer 960 to be generated at its respective Y outputs. If the SCS1 bit is set to a logical low or zero and coupled into S0, the I0 inputs (output from XNOR gate 974, and address bits A3, A5, A6, A7, and A8) are selected to be output from the multiplexer 960 onto the respective internal address signal lines A3'-A8'. In this manner the independent address information for the sub-channel zero may be selected off the address lines, swizzled, and captured. However if the SCS1 bit is set to a logical high or one and coupled into S0, the I1 inputs (output from XNOR gate 975, the output from inverter 976, and address bits A2, A11, A12, and A13) are selected to be output from the multiplexer 960 onto the respective internal address signal lines A3'-A8'. In this manner the independent address information for the sub-channel one may be selected off the address lines, swizzled, and captured.

Figure 10:
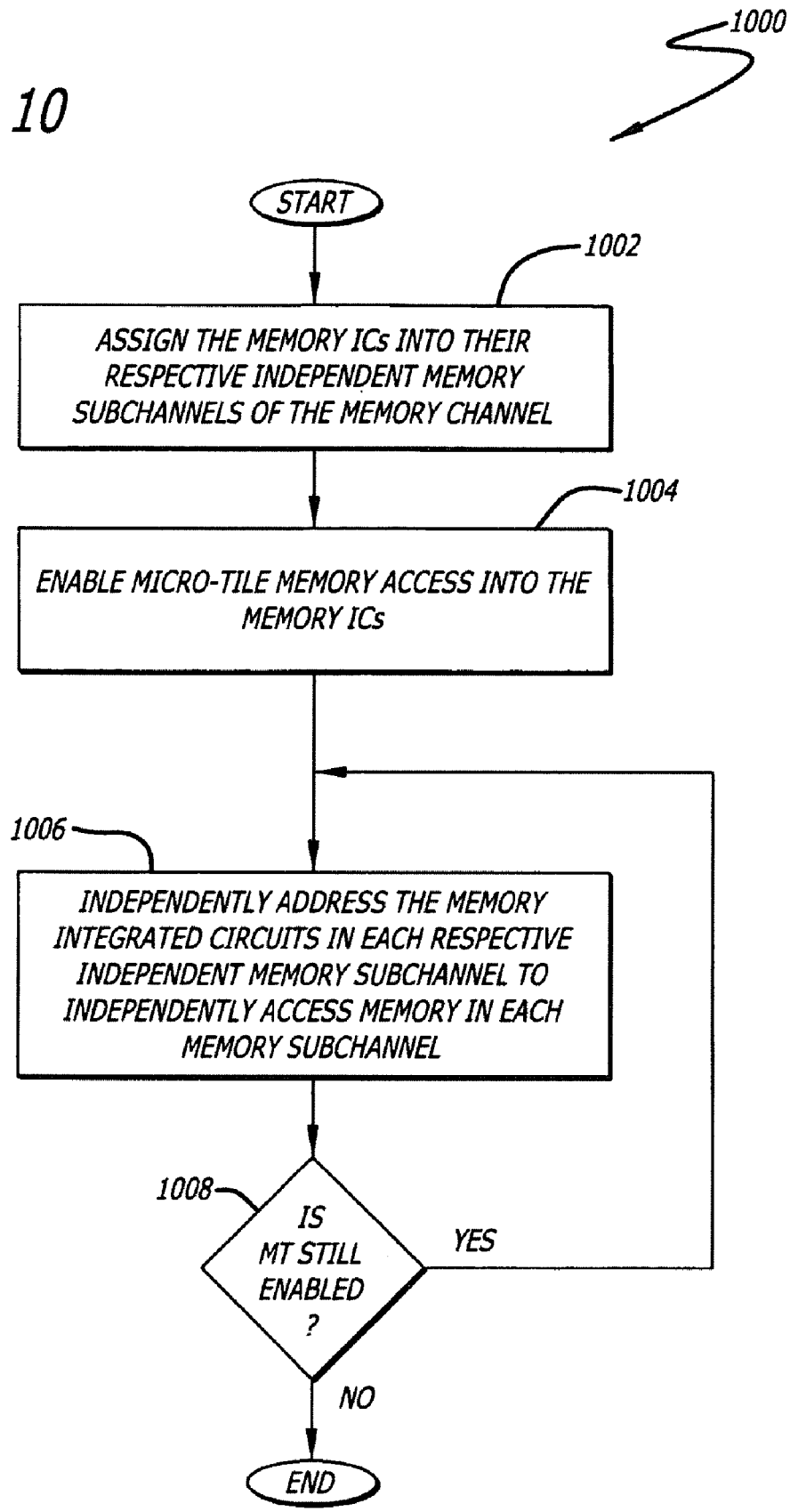
FIG. 10 illustrates a flow chart of a method for a memory integrated circuit to provide micro-tile memory access.

The AND gates 906-911 in the control logic 930 function similarly to the AND gates 906-911 in the control logic 812B gating the same address signals A0-A2 and A11-A12 to zero on the internal address lines A0'-A2' and A11'-A12', respectively, in the response to the micro-tile mode (MTM#) signal 902B being active low. Additionally, AND gate 969 gates the address signal A10 to zero on the internal address line A10' in the response to the micro-tile mode (MTM#) signal 902B being active low Referring now to FIG. 10, a method 1000 for the memory integrated circuit is illustrated to provide micro-tile memory operations.

At block 1002, the memory integrated circuits are assigned to their respective independent memory sub-channels of the memory channel. That is, the one or more sub-channel select bits in the mode register within the memory integrated circuit are set to assign the memory IC to a predetermined memory sub-channel.

At block 1004, micro-tile memory access into the memory integrated circuits is enabled. That is, the micro-tile enable MTE bit in the mode register within the memory integrated circuit is set to enable micro-tile memory accesses therein. If the MTE bit is active high, it is set to a high logic level. If the MTE bit is active low ("MTE#"), the MTE# bit is set to a logic low level.

At block 1006, memory cells in one or more memory integrated circuits in one memory sub-channel are independently addressed from memory cells in one or more memory integrated circuits in another sub-channel. That is, the memory integrated circuits are independently addressed in their respective independent memory sub-channels to independently access memory in each memory sub-channel.

As discussed previously, the independent addressing into the sub-channels may be provided in different ways. One way that independent addressing into the sub-channels may be provided is by concurrently capturing independent address information in each respective memory sub-channel on pre-existing address signal lines during unused memory cycles, such as during a CAS cycle where column addresses are being written. Another way that independent addressing into the sub-channels may be provided is by routing independent address signal lines between a memory controller and the memory integrated circuits in the respective independent memory sub-channels of the memory channel.

Yet another way that independent addressing into the sub-channels may be provided is by re-assigning unused pins of an edge connection to be independent address pins and routing independent address signal lines between the independent address pins of the edge connector and the plurality of memory integrated circuits in the respective independent memory sub-channels on a memory module. In which case, the independent addressing may be further provided by routing independent address signal lines between a memory controller and pins of an edge connector to couple to the independent address pins of the edge connection on the memory module. The unused pins of the edge connection may be error correction control pins, parity pins, or a combination thereof.

So long as micro-tiling is enabled, the micro-tile memory accesses may occur over a memory channel into each memory sub-channel. At block 1008, a determination is made as to whether or not micro-tiling is still enabled in the memory integrated circuits. A check of the MTE bit in the mode register may be made to determine whether or not micro-tiling is still enabled or not. If micro-tiling is still enabled, the process jumps back to block 1006 ready for the next access into the memory integrated circuits using micro-tiling. If micro-tiling is no longer enabled, the process ends and normal linear addressing may occur.

Previously, integrated graphics controllers based on UMA memory architectures tended to be bandwidth limited. Modeling of the embodiments of the invention suggests that applying micro-tiling to UMA memory architectures can reduce texture memory access bandwidth by 20-40% to make memory accesses more efficient. Color and depth memory access bandwidth can be reduced by about 10-20% for game workloads by applying micro-tiling to make memory accesses more efficient.

To support a micro-tiling memory architecture, the memory subsystem has been improved to allow sub-channel accesses. Embodiments of the invention have shown that micro-tiling can be implemented and still be backward compatible with pre-existing memory module form factors and standards. Previously, there was no method available to route additional address signal lines over the pre-existing memory module (e.g., DIMM) connectors. Embodiments of the invention have provided a solution to this by overloading the pre-existing address lines with independent address information for each sub-channel. Other methods to supply the independent address information to each sub-channel may be provided if backward compatibility is not important.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art.

What is claimed is:

1. An apparatus comprising:
   an address bus having a plurality of address signals lines to carry shared address signals and independent address signals;
   an address decoder to selectively access memory cells within a memory array using memory cell address lines, the address decoder accessing memory cells to fill an entire memory channel and accessing memory cells to fill at least one sub-channel of the memory channel, each memory sub-channel comprising a portion of a memory channel and carrying a smaller number of bits than the entire memory channel;
   a mode register to store a plurality of sub-channel select bits, each sub-channel select bit indicating the selection of one of the plurality of memory sub-channels; and
   control logic coupled to the address bus, the address decoder, and the mode register, the control logic, in response to each sub-channel select bit, to select a corresponding portion of the address signal lines to support access through the corresponding memory sub-channel and to couple the independent address lines into the address decoder.

2. The apparatus of claim 1, wherein the mode register is further to store an enable bit, the enable bit indicating that memory sub-channels are enabled or alternatively that only the entire memory channel is enabled.

3. The apparatus of claim 2, wherein the enable bit is a micro-tile enable bit and the independent sub-channel memory access into the memory array is a micro-tile memory access.

4. The apparatus of claim 1, wherein the selection of the one or more address signal lines by the control logic is further to capture independent address information responsive to a column address load signal.

5. The apparatus of claim 1, wherein the control logic includes a multiplexer to select address signal lines on which to capture independent address information, the multiplexer having a plurality of inputs coupled to a subset of the plurality of address signal lines to receive independent column addresses, the multiplexer to select one or more of the independent column address signals as independent sub-channel column address signals to be provided on respective multiplexer outputs in response to a sub-channel select bit.

6. The apparatus of claim 5, wherein the multiplexer is further to swizzle the independent address information from a first significant address bit to a second significant address bit.

7. The apparatus of claim 1, wherein the independent address signals include independent row address signals and independent column address signals, the apparatus further comprising a column address load strobe pin to receive a column address load strobe signal to selectively receive one or more of the independent column address signals on the address bus.

8. The apparatus of claim 5, wherein the independent sub-channel column address signals are associated with a predetermined memory sub-channel.

9. The apparatus of claim 1, wherein the control logic comprises a plurality of multiplexers to select one or more of the independent column address signals as independent sub-channel column address signals in further response to the enable bit, the column address load strobe signal, and a transaction enable signal.

10. The apparatus of claim 9, wherein the plurality of multiplexers are three-into-one multiplexers each having a second select control input coupled together and to an enable bit, the first plurality of multiplexers to select one or more of the independent column address signals as the independent sub-channel column address signals in further response to the enable bit.

11. The apparatus of claim 9, wherein the register stores a second sub-channel select bit, and the apparatus further includes swizzle logic coupled between one or more of the plurality of address signal lines and the first plurality of multiplexers, the swizzle logic selectively inverting one or more of the independent column address signals coupled into the first plurality of multiplexers in response to the second sub-channel select bit.

12. The apparatus of claim 9, further comprising:
    a second plurality of multiplexers coupled between the first plurality of multiplexers and the column address decoder,
    each of the multiplexers of the second plurality of multiplexers having a second select control input coupled together and to a micro-tile mode signal,
    a plurality of multiplexer inputs of the respective multiplexer output,
    a first half of the plurality of multiplexer inputs of the second plurality of multiplexers respectively coupled to the multiplexer outputs of the first plurality of multiplexers and a second half of the plurality of multiplexer inputs of the second plurality of multiplexers, respectively, coupled to the plurality of address pins,
    the second plurality of multiplexers to select the multiplexer outputs of the first plurality of multiplexers to be provided on respective multiplexer outputs in response to the micro-tile mode signal being active and
    to select the shared row address signals and shared column address signals to be provided on the respective multiplexer outputs in response to the micro-tile mode signal being inactive.

13. A method comprising:
    receiving a plurality of shared address signals and independent address signals on a plurality of address signal lines of an address bus;
    storing a plurality of sub-channel select bits in a mode register, each sub-channel select bit indicating the selection of one of a plurality of memory sub-channels
    in response to each sub-channel select bit, selecting a corresponding portion of the address signal lines to support access to a memory cells within a memory array through the corresponding memory sub-channel and to couple the independent address lines into an address decoder;
    decoding the address signals in the address decoder to selectively access the memory cells within the memory array to fill an entire memory channel and to selectively access memory cells to fill at least one sub-channel of the memory channel, each memory sub-channel comprising a portion of a memory channel and carrying a smaller number of bits than the entire memory channel.

14. The method of claim 13, further comprising storing an enable bit in the mode register, the enable bit indicating that memory sub-channels are enabled or alternatively that only the entire memory channel is enabled.

15. The method of claim 13, wherein the selecting a corresponding portion of the address signal lines further comprises selecting one or more address signal lines responsive to a column address load signal to capture independent address information.

16. The method of claim 13, further comprising selectively receive one or more independent column address signals on the address bus responsive to receiving a column address load strobe signal.

17. The method of claim 13, further comprising selectively inverting one or more independent column address signals coupled to the address decoder in response to a sub-channel select bit.

* * * * *